(12) United States Patent
Hwang et al.

(10) Patent No.: US 11,581,375 B2
(45) Date of Patent: Feb. 14, 2023

(54) DISPLAY DEVICE

(71) Applicant: LG Display Co., Ltd., Seoul (KR)

(72) Inventors: JongHee Hwang, Paju-si (KR); KiDuk Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 247 days.

(21) Appl. No.: 16/929,797

(22) Filed: Jul. 15, 2020

(65) Prior Publication Data

US 2021/0126066 A1      Apr. 29, 2021

(30) Foreign Application Priority Data

Oct. 23, 2019   (KR) ........................ 10-2019-0132471

(51) Int. Cl.
| | | |
|---|---|---|
| *H01L 27/32* | (2006.01) | |
| *H01L 51/52* | (2006.01) | |
| *G09G 3/3266* | (2016.01) | |
| *G06F 3/044* | (2006.01) | |
| *G06F 3/041* | (2006.01) | |
| *G06V 40/13* | (2022.01) | |

(52) U.S. Cl.
CPC ........ *H01L 27/3246* (2013.01); *G06F 3/0412* (2013.01); *G06F 3/0446* (2019.05); *G06V 40/1306* (2022.01); *G09G 3/3266* (2013.01); *H01L 27/323* (2013.01); *H01L 27/3234* (2013.01); *H01L 27/3276* (2013.01); *H01L 51/5246* (2013.01); *H01L 51/5293* (2013.01); *G06F 2203/04112* (2013.01)

(58) Field of Classification Search
CPC ............... H01L 27/3246; H01L 27/323; H01L 27/3234; H01L 27/3276; H01L 51/5246; H01L 51/5293; H01L 51/5221; H01L 27/3244; H01L 51/5215; H01L 27/3211; H01L 51/5262; G06F 3/0412; G06F 3/0446; G06F 2203/04112; G06F 21/32; G06V 40/1306; G06V 10/17; G06V 10/147; G06V 40/1318; G06V 40/12; G09G 3/3266; G09G 3/3208
See application file for complete search history.

(56) References Cited

U.S. PATENT DOCUMENTS

2021/0064172 A1*  3/2021 Lee .................. G06F 3/0446

* cited by examiner

*Primary Examiner* — Kyoung Lee
(74) *Attorney, Agent, or Firm* — Fenwick & West LLP

(57) ABSTRACT

The present disclosure relates to a display device including an optical device, more specifically, it relates to a display device in which the optical device is positioned under the display panel so that the optical device is not exposed in the front direction. Even if the optical device is located under the display panel, the display device can normally perform the function of the optical device related to the front direction of the display panel and have a structure for this.

29 Claims, 30 Drawing Sheets

Area Z

DISPLAY DEVICE

CROSS-REFERENCE TO RELATED APPLICATIONS

This application claims the benefit and priority from Republic of Korea Patent Application No. 10-2019-0132471, filed in the Republic of Korea on Oct. 23, 2019, the entire contents of which are hereby incorporated by reference in its entirety.

BACKGROUND

Technical Field

The present disclosure relates to a display device.

Description of the Related Art

As the information society develops, demands for display devices displaying images are increasing, and various types of display devices such as liquid crystal display devices, organic light emitting display devices, or quantum dot display devices are being used.

In addition, the display device provides an input method using a touch sensor or the like, and an optical device such as a camera and a proximity sensor to provide a variety of application functions to the user. Due to this, there is a problem that the design of the display device becomes difficult. In particular, since the camera and the proximity sensor are forced to be exposed to the outside for the entrance and exit of light, there is a problem in that the display area of the display panel must be reduced.

Accordingly, in the related art, the front design of the display device is designed as a design having a large bezel for installation and exposure of the optical device, a design in which the display panel is cut out in a notch shape, or the optical device is displayed. There has been a problem that is designed with a design that is exposed in the form of a hole in a part of the panel.

SUMMARY

An aspect of embodiments of the present disclosure is to provide a display device having a design in which an optical device requiring light is not exposed to the outside at all.

Another aspect of embodiments of the present disclosure is to provide a display device including an optical device disposed to overlap the display area under the display panel, wherein in a display device, the optical devices are not exposed at all, and wherein the optical device may include one or more of a camera and a proximity sensor.

Another aspect of embodiments of the present disclosure is to provide a display device that does not degrade the performance of the optical device while reducing the optical device from being exposed to the outside at all.

Another aspect of embodiments of the present disclosure is to provide a display device having a structure that reduces the optical device from being exposed to the outside without deteriorating the performance and display performance of the optical device.

Another aspect of embodiments of the present disclosure is to provide a display device capable of sensing fingerprints in all or part of the display panel.

In accordance with an aspect of the present disclosure, there can be provided a display device comprising: a transparent substrates; an optical device positioned in a display area under the transparent substrate; a transistor array positioned in the display area over the transparent substrate; an anode electrode layer positioned on the transistor array; a light emitting layer positioned on the anode electrode layer; a heterogeneous cathode electrode layer positioned on the light emitting layer and comprising a first cathode electrode and a second cathode electrode, wherein the first cathode electrode overlaps the optical device and is disposed in a first area which is a part of the display area, the second cathode electrode is disposed in a second area different from the first area in the display area, the first cathode electrode has a first transmittance, and the second cathode electrode has a second transmittance lower than the first transmittance; and an encapsulation layer disposed on the heterogeneous cathode electrode layer.

The first cathode electrode may be a transparent electrode having the first transmittance equal to or greater than a predetermined threshold transmittance, and the second cathode electrode may be a translucent electrode having the second transmittance less than the predetermined threshold transmittance. The predetermined threshold transmittance may be a minimum transmittance that allows the functions of the camera and the proximity sensor to be normally performed.

The display device may further comprise: a bank defining an emission area of each of a plurality of subpixels, wherein the bank positioned between the anode electrode layer on which an anode electrode disposed in each of the plurality of subpixels is located, and the heterogeneous cathode electrode layer; and a spacer disposed in a boundary area between the first area and the second area, and positioned on the bank, A boundary point between the first cathode electrode and the second cathode electrode may be on the spacer.

The first area may have a first resolution, the second area may have a second resolution, and the first resolution may be lower than the second resolution.

Subpixels disposed in the first area may constitute subpixel clusters including two or more subpixels, A separation distance between the subpixel clusters may be greater than a separation distance between two or more subpixels included in each of the subpixel clusters.

The number of subpixels per unit area in the first area may be less than the number of subpixels per unit area in the second area, and wherein the subpixel clusters in the first area may be regularly arranged.

In each of the subpixel clusters, the number of green subpixels may be greater than the number of blue subpixels and the number of red subpixels.

The display device may further comprise: a touch sensor layer disposed on the encapsulation layer and including a plurality of touch electrodes; a touch pad unit disposed on the transparent substrate and positioned in a non-display area, which is an outer area of the display area; and a plurality of touch lines electrically connected to all or part of the touch electrodes and descending along an inclined surface of the encapsulation layer to be electrically connected to the touch pad unit positioned in the non-display area.

Each of the touch electrodes positioned in the first area among the plurality of touch electrodes may comprise a transparent electrode or a mesh-type electrode having one or more openings.

The display device may further comprise: a polarizing plate disposed on the touch sensor layer; an optical transparent adhesive disposed on the polarizing plate; and a cover glass located on the optical transparent adhesive, The polarizing plate may comprise a first portion corresponding to the first area and a second portion corresponding to the second area, and wherein the first portion may have a higher transmittance than the second portion.

The optical device may comprise a camera.

The display device may further comprising: a light generating device; and a proximity sensor detecting a surrounding human body or object using light emitted from the light generating device, The optical device may further comprise the proximity sensor.

The light generating device may be located on the encapsulation layer and is located on the side of the touch sensor layer.

The light generating device may be located in a viewing area between the inclined surface of the encapsulation layer and the display area.

The proximity sensor may be located under the transparent substrate.

The proximity sensor may be positioned to overlap the first area.

The display device may further comprise a fingerprint sensor panel disposed under the transparent substrate and including a plurality of fingerprint sensor blocks, wherein the fingerprint sensor panel may comprise a hole or notch groove positioned in a portion corresponding to the first area.

The fingerprint sensor panel may comprise: a substrate disposed under the transparent substrate and comprising the hole or notch groove positioned in the portion corresponding to the first area; a fingerprint transistor array disposed on the substrate and comprising transistors disposed in each of the plurality of fingerprint sensor blocks; a piezoelectric material layer disposed under the fingerprint transistor array; a common electrode disposed under the piezoelectric material layer; a plurality of scan lines disposed on the substrate to transmit scan signals to a plurality of fingerprint sensor block rows; and a plurality of read-out lines disposed on the substrate to sense signals from the plurality of fingerprint sensor block rows.

The fingerprint sensor panel may further comprise a plurality of scan driving blocks disposed on the substrate and disposed in an outer area of the fingerprint sensor area where the fingerprint transistor array is disposed on the substrate, wherein the plurality of scan driving blocks output the scan signals.

The plurality of scan driving blocks may comprise a first scan driving block located on one side and a second scan driving block located on the other side, based on the hole or notch groove in the substrate.

The plurality of scan lines may comprise one or more first scan lines for transmitting scan signals output from the first scan driving block to one or more fingerprint sensor block rows located at one side of the hole or notch groove, and one or more second scan lines for transmitting scan signals output from the second scan driving block to one or more fingerprint sensor block rows located at the other side of the hole or notch groove.

The plurality of read-out lines may include at least one read-out line arranged in a column direction while bypassing the side of the hole or notch groove.

The display device may further comprise: a touch driving circuit configured to generate touch sensing data through the touch electrodes and output the touch sensing data; a fingerprint driving circuit configured to generate fingerprint sensing data through the fingerprint sensor panel and output the fingerprint sensing data; and a processor configured to determine a touch location based on the touch sensing data and recognize a fingerprint based on the fingerprint sensing data.

The fingerprint driving circuit may selectively drive one or more fingerprint sensor blocks corresponding to the touch position among the plurality of fingerprint sensor blocks included in the fingerprint sensor panel.

The plurality of fingerprint sensor blocks may be disposed to correspond to all areas except the first area in the display area.

The first area may be located in the display area, and is located at a boundary with a non-display area that is an outer area of the display area, and wherein only a part of the first area may be surrounded by the second area.

The first area may be located in the center of the display area, and wherein the first area may be surrounded by the second area in all directions.

According to embodiments of the present disclosure, by arranging the optical device under the display panel, it is possible to provide a display device having a design in which an optical device requiring light reception is not exposed to the outside at all.

In addition, according to embodiments of the present disclosure, it is possible to provide a display device in which one or more optical devices of a camera and a proximity sensor are disposed to overlap with a display area under a display panel. Accordingly, one or more optical devices can be reduced from being exposed to the outside of the display device. Therefore, the user cannot visually identify one or more optical devices (or lenses thereof) of the camera and proximity sensor.

In addition, according to embodiments of the present disclosure, it is possible to provide a display device that does not degrade the performance of the optical device while reducing the optical device from being exposed to the outside at all.

In addition, according to embodiments of the present disclosure, it is possible to provide a display device having a structure that reduces the optical device from being exposed to the outside without deteriorating the performance and display performance of the optical device.

In addition, according to embodiments of the present disclosure, it is possible to provide a display device capable of sensing fingerprints in all or part of the display panel. Through this, various applications related to fingerprint recognition can be provided.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
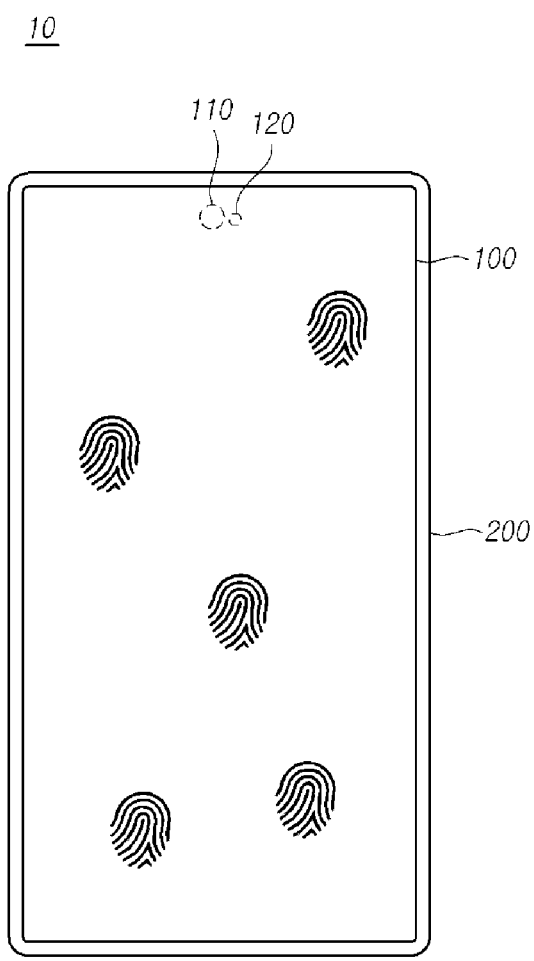
FIG. 1 is a view showing the display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a view showing the display device 10 according to embodiments of the present disclosure.

The display device 10 according to embodiments of the present disclosure can provide a function of displaying an image, a function of sensing a touch using a finger or a pen, and a function of sensing a fingerprint.

Referring to FIG. 1, the display device 10 according to embodiments of the present disclosure may include a display panel 100 displaying an image and a case 200 protecting the display panel 100. In FIG. 1, when a user views the front surface of the display device 10, a part of the case 200 may be shown. In some cases, when the display device 10 is implemented in a full-display type, when the user looks at the front of the display device 10, the case 200 may be invisible or almost invisible, and only the display panel 100 may be visible. When the user looks at the front of the display device 10, only the display area of the display panel 100 can be visible. In some cases, the display area and a non-display area outside the display area (also referred to as a bezel) can be viewed together.

Referring to FIG. 1, the display device 10 according to embodiments of the present disclosure can sense a touch by a finger or a pen or the like across the entire display area of the display panel 100, and sense a fingerprint across the entire display area of the display panel 100. That is, the display device 10 according to embodiments of the present disclosure can provide touch sensing and fingerprint sensing for all areas.

The display device 10 according to embodiments of the present disclosure includes an optical device. For example, the optical device may include one or more of a camera 110 for photographing and a proximity sensor 120 for detecting a human body or an object approaching the surroundings. The camera 110 of the present specification may be a front camera that photographs the front surface of the display device 10.

When the display device 10 according to the embodiments of the present disclosure is viewed from the front, one or more optical devices of the camera 110 and the proximity sensor 120 are not visible. To this end, the display device 10 according to embodiments of the present disclosure has a structure in which one or more optical devices of the camera 110 and the proximity sensor 120 may be positioned under the display panel 100. In this specification, the camera 110 that is not exposed to the outside and is located under display panel 100 is also referred to as an under display camera (UDC). The display device 10 including the camera 110 is referred to as a camera built-in display.

As described above, although the optical device is located under the display panel 100, the display device 10 according to the embodiments of the present disclosure can normally perform a photographing function of the camera 110 and/or a proximity sensing function of the proximity sensor 120 through a unique structure. This will be described in detail below FIG. 2 is a view showing a screen configuration of the display device 10 according to embodiments of the present disclosure.

Figure 2:
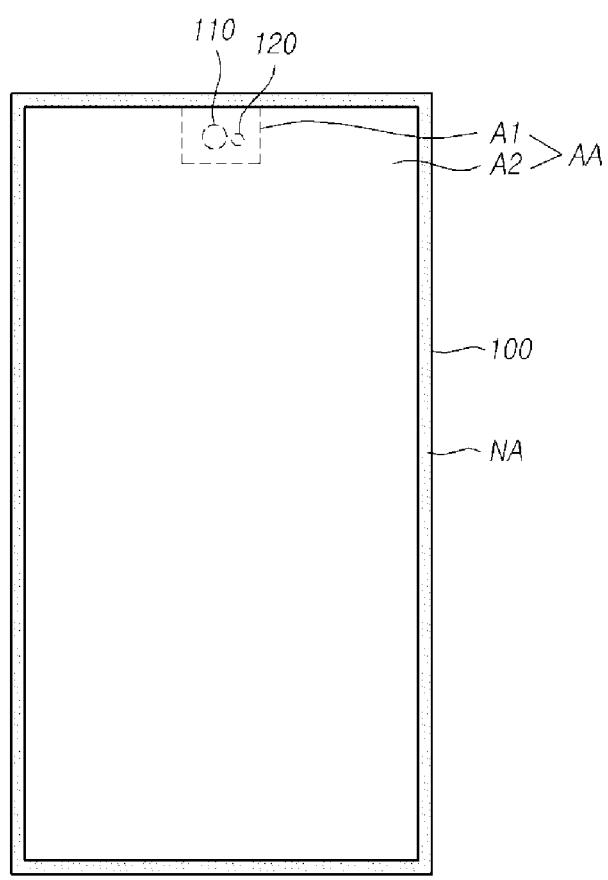
FIG. 2 is a view showing a screen configuration of the display device according to embodiments of the present disclosure.

Referring to FIG. 2, the display panel 100 can include a display area AA in which an image is displayed and a non-display area NA which may be an outer area of the display area AA without displaying an image.

Referring to FIG. 2, the display area AA may include a first area A1 and a second area A2. The first area A1 may be a camera area, or may overlap all or part of the camera area or may include a camera area. Here, the camera area may be an area where the lens of the camera 110 is located, and may also be referred to as a camera lens area or a photographing area. In this specification, the camera 110 overlapping the first area A1 may mean a camera lens. The first area A1 may be a proximity sensing area, or may overlap all or part of the proximity sensing area or may include a proximity sensing area. Here, the proximity sensing area may be an area capable of detecting an approach of an object or a human body by the proximity sensor 120.

For example, when a user grasps the display device 10 and photographs himself/herself, the user may shoot while looking at the first area A1. When the user covers the first area A1 with a face or a finger, the display device 10 detects the proximity of the user's face or finger through the proximity sensor 120 and performs a predetermined operation (e.g., screen off, etc.) according to the detection result.

The first area A1 in the display area AA may be a path (light incident part) through which light enters the optical device. Here, the light may be an electromagnetic file such as visible light, infrared light, or ultraviolet light.

Referring to FIG. 2, one or more optical devices of the camera 110 and the proximity sensor 120 may be located under the first area A1. That is, one or more optical devices of the camera 110 and the proximity sensor 120 may overlap the first area A1.

Figure 3:
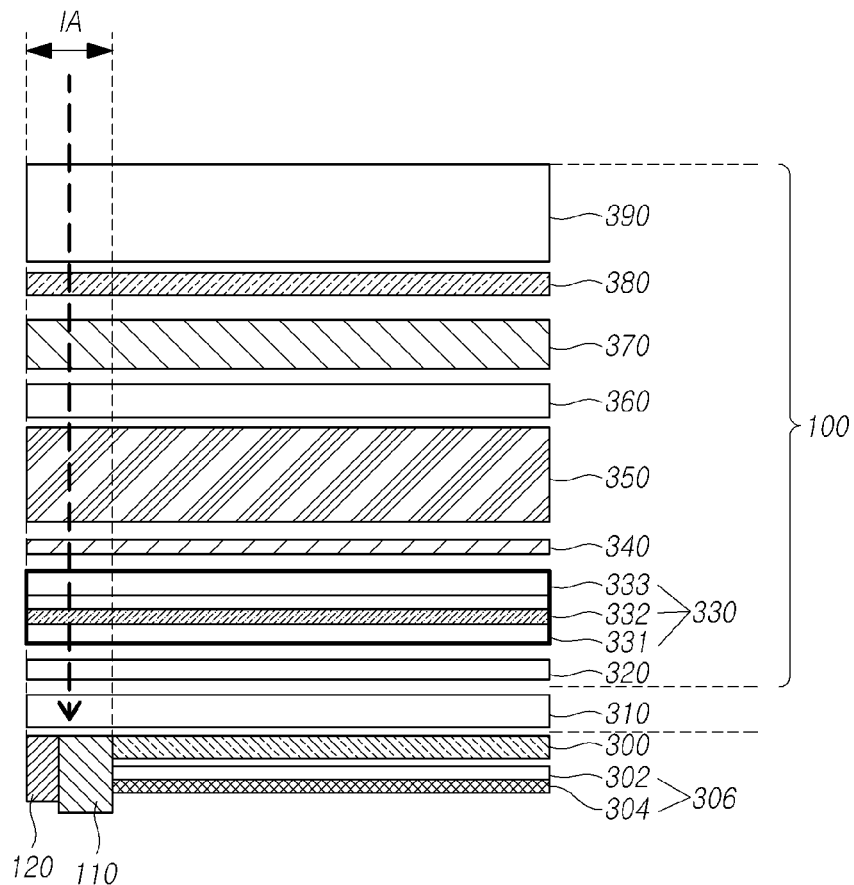
FIG. 3 is a schematic cross-sectional view of the display device according to embodiments of the present disclosure.

FIG. 3 is a schematic cross-sectional view of the display device 10 according to embodiments of the present disclosure.

Referring to FIG. 3, the display device 10 according to embodiments of the present disclosure includes an optical device (e.g., camera 110, proximity sensor 120, etc.) positioned under the display panel 100 and overlapping the display area AA. Nevertheless, the display device 10 according to the embodiments of the present disclosure can normally perform an intrinsic function (e.g., shooting function, light receiving function of the proximity sensor 120, etc.) of the optical device, and also perform a display function normally. The display device 10 according to the embodiments of the present disclosure has a structure (in particular, the structure in the first area A1) such that the original function of the optical device is normally performed and the display function is also normally performed.

Referring to FIG. 3, the display device 10 according to embodiments of the present disclosure has a unique structure in a light incident part IA, which means a space in a panel through which light enters for the function of an optical device. The light incident part IA may be positioned in the display area AA and may overlap with all or part of the first area A1.

Referring to FIG. 3, the display device 10 according to embodiments of the present disclosure may include a transparent substrate 320, a subpixel forming unit 330, a heterogeneous cathode electrode layer 340, an encapsulation layer 350, and a touch sensor layer 360. The subpixel forming unit 330 may be positioned over the transparent substrate 320 and may include subpixel patterns formed to form a plurality of subpixels SP. The heterogeneous cathode electrode layer 340 may be positioned on the subpixel forming unit 330 and a cathode voltage corresponding to a common voltage is applied. The encapsulation layer 350 may be disposed on the heterogeneous cathode electrode layer 340 and has an inclined surface at the outer side. The touch sensor layer 360 may be disposed on the encapsulation layer 350 and may include a plurality of touch electrodes.

The subpixel forming unit 330 may include a transistor array 331, an anode electrode layer 332, a light emitting layer 333, and the like. The transistor array 331 may be positioned over the transparent substrate 320 and may be located in the display area AA. The transistor array 331 may include one or more transistors disposed in each of the plurality of subpixels. The anode electrode layer 332 may be disposed on the transistor array 331 and may be disposed on each of a plurality of subpixels and may include an anode electrode electrically connected to a source node or a drain node of the corresponding transistor. The light emitting layer 333 may be positioned on the anode electrode layer 332 and may be positioned on the corresponding anode electrode in each of the plurality of subpixels.

The heterogeneous cathode electrode layer 340 may be positioned on the light emitting layer 333. The anode electrode layer 332, the light emitting layer 330, and the heterogeneous cathode electrode layer 340 form a plurality of light emitting elements (e.g., OLED (organic light emitting diode), etc.) for each subpixel.

The touch sensor layer 360 may include a plurality of touch electrodes, and may further include a plurality of touch lines electrically connected to all or part of the plurality of touch electrodes.

For example, the plurality of touch electrodes may be disposed on one layer or may be divided and disposed on two or more layers separated by an insulating layer. The plurality of touch lines may be located on a different layer from the plurality of touch electrodes, or may be located on the same layer as some of the plurality of touch electrodes.

The plurality of touch electrodes may be disposed in the display area AA. Each of the plurality of touch lines may electrically connect a corresponding touch electrode positioned in the display area AA and a pad part positioned in the non-display area NA. Accordingly, a plurality of touch lines pass through the non-display area NA. The plurality of touch lines may descend along the inclined surface of the encapsulation layer 350 and be electrically connected to the pad portion.

Referring to FIG. 3, the display device 10 according to embodiments of the present disclosure may further include a polarizing plate 370 disposed on the touch sensor layer 360, an optical transparent adhesive 380 disposed on the polarizing plate 370, and a cover glass 390 disposed on the optical transparent adhesive 380.

Referring to FIG. 3, the display panel 100 may include the transparent substrate 320, the subpixel forming unit 330, the heterogeneous cathode electrode layer 340, the encapsulation layer 350, the polarizing plate 370, the optical transparent adhesive 380, the cover glass 390 and the like.

Referring to FIG. 3, the display device 10 according to embodiments of the present disclosure may further include a fingerprint sensor panel 300 positioned under the display panel 100. That is, the fingerprint sensor panel 300 may be located under the transparent substrate 320.

Referring to FIG. 3, when present in the air layer between the display panel 100 and the fingerprint sensor panel 300, the fingerprint sensing performance through the fingerprint sensor panel 300 may deteriorate or the fingerprint sensing itself may not be possible. Accordingly, the display panel 100 and the fingerprint sensor panel 300 may be bonded with a bonding material so that the air layer does not exist between the display panel 100 and the fingerprint sensor panel 300. For example, the bonding material may include resin, optical clear adhesive OCA, pressure sensitive adhesive PSA, or the like.

Referring to FIG. 3, the display device 10 according to embodiments of the present disclosure may further include a back plate 310 positioned between the display panel 100 and the fingerprint sensor panel 300. The display panel 100 may be bonded to the top surface of the back plate 310, and the fingerprint sensor panel 300 may be bonded to the bottom surface of the back plate 310. Here, the back plate 310 may not be an essential configuration.

Referring to FIG. 3, the display device 10 according to embodiments of the present disclosure further may include a cushion plate 306 positioned under the fingerprint sensor panel 300 and protecting a lower portion of the fingerprint sensor panel 300. The cushion plate 306 may include a foam pad 302 and a metal plate 304 (made of copper (Cu) for example) or the like.

Referring to FIG. 3, the display device 10 according to embodiments of the present disclosure includes the optical device positioned in the display area AA and disposed under the transparent substrate 320. For example, the optical device may include one or more of the camera 110 and the proximity sensor 120.

Referring to FIG. 3, the camera 110 and the proximity sensor 120 may be located in the first area A1 in the display area AA. That is, the camera 110 and the proximity sensor 120 may overlap the first area A1 in the display area AA.

Referring to FIG. 3, the light incident part IA may be a light path. More specifically, the light incident part IA may be a path through which light (e.g., visible light) for photographing of the camera 110 enters or exits, and light (e.g., infrared) for sensing by the proximity sensor 120 enters and exits. On a plane, the light incident part IA may correspond to the first area A1 or may be included in the first area A1. When viewed vertically, the light incident part IA may be an area from the cover class 390 corresponding to the front surface of the display device 10 to the optical device.

The first area A1 may be a camera area (camera lens area) in which the lens of the camera 110 for photographing may be located, and may be a proximity sensing area capable of sensing an approach of an object or a human body.

Since the first area A1 may be the light incident part IA, light must be well transmitted through the first area A1.

To this end, each of the layers 390, 380, 370, 360, 350, 340, 330, and 310 located in the light incident part IA, which may be the light incident path, may have a transmittance of more than a predetermined threshold transmittance. All or part (corresponding to the first area A1) of each of the layers 390, 380, 370, 360, 350, 340, 330, and 310 positioned in the light incident part IA may have a transmittance equal to or greater than the predetermined threshold transmittance. The predetermined threshold transmittance may be a minimum transmittance value that enables each function of the camera 110 and the proximity sensor 120. The term "transmittance" is also referred to as "transparency" in one embodiment. This will be described in more detail below.

Meanwhile, as illustrated in FIG. 2, the first area A1 may be located in the display area AA, and may be located outside the display area AA. Alternatively, the first area A1 may be located in the display area AA, and may be located in the center of the display area AA. The first area A1 may have a predetermined shape (e.g., polygons such as squares, hexagons, rounds, ovals, etc.) when viewed from over.

Figure 4:
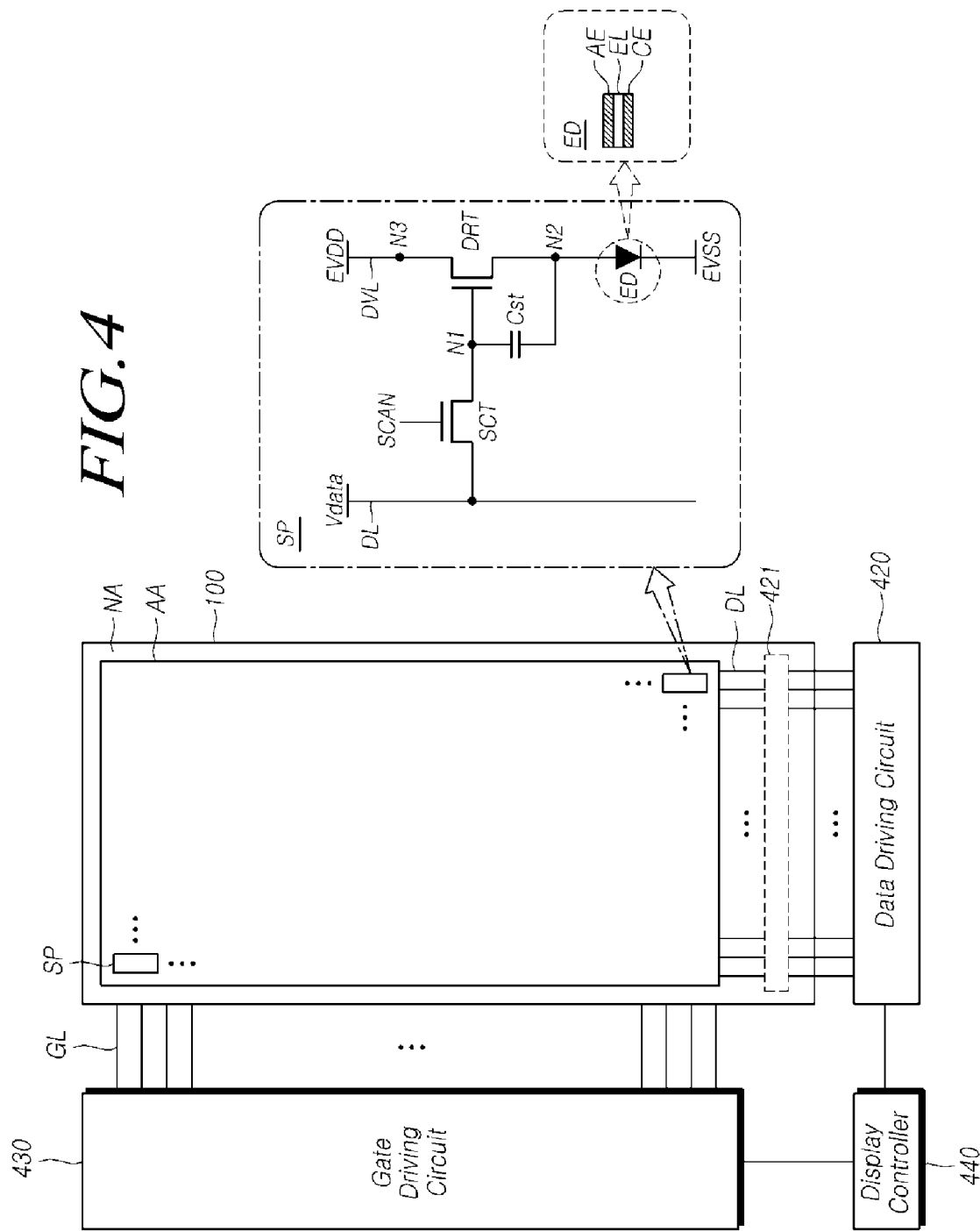
FIG. 4 is a configuration diagram of a display part of the display device according to embodiments of the present disclosure.

FIG. 4 is a configuration diagram of a display part of the display device 10 according to embodiments of the present disclosure.

Referring to FIG. 4, a display part of the display device 10 according to embodiments of the present disclosure may include a display panel 100 in which a plurality of data lines DL, a plurality of gate lines GL, and a plurality of subpixel SP may be disposed, a data driving circuit 420 for driving the plurality of data lines DL, a gate driving circuit 430 for driving the plurality of gate lines GL, and a display controller 440 for controlling the operation of the data driving circuit 420 and the gate driving circuit 430.

The data driving circuit 420 may supply the image data voltage Vdata to the plurality of data lines DL according to the timing control of the display controller 440. The gate driving circuit 430 may sequentially supply the scan signals SCAN to the plurality of gate lines GL according to the timing control of the display controller 440.

The plurality of data lines DL disposed in the display area AA of the display panel 100 are electrically connected to the display pad unit 421 located in the non-display area NA of the display panel 100. The data driving circuit 420 is electrically connected to the display pad unit 421.

The data driving circuit 420 may be implemented with a chip on film (COF) type, and may be mounted on a circuit film bonded to the display pad unit 421 of the display panel 100. Alternatively, the data driving circuit 420 may be implemented in a COG (chip-on-glass) type or a COP (chip-on-panel) type, and may be directly mounted on the display pad unit 421 of the display panel 100.

The gate driving circuit 430 may be implemented in a COF (chip-on-film) type, and may be mounted on a circuit film electrically connected to the display panel 100. Alternatively, the gate driving circuit 430 may be implemented in a COG (chip-on-glass) type or a COP (chip-on-panel) type, and may be mounted on the non-display area NA of the display panel 100. Alternatively, the gate driving circuit 430 may be implemented in a GIP (gate-in-panel) type to be formed in the non-display area NA of the display panel 100.

The display device 10 according to embodiments of the present disclosure may be a liquid crystal display (LCD) including a backlight unit. Alternatively, the display device 10 according to embodiments of the present disclosure may be a self-luminous display such as an organic light emitting diode (OLED) display, a quantum dot display, or a micro light emitting diode (μLED) display.

When the display device 10 according to the embodiments of the present disclosure may be an OLED display, each subpixel SP may include an organic light emitting diode (OLED) that emits light as a light emitting device. When the display device 10 according to the present exemplary embodiments may be a quantum dot display, each subpixel SP may include a light emitting device made of quantum dots, which may be semiconductor crystals that emit light themselves. When the display device 10 according to the present embodiments may be a micro LED display, each sub-pixel SP emits light itself and may include a micro LED (micro light emitting diode) made of an inorganic material as a light emitting device.

In the display device 10 according to embodiments of the present disclosure, each subpixel SP may include a light-emitting device ED, a driving transistor DRT for controlling the current flowing through the light emitting element ED, a scan transistor SCT for transferring the image data voltage Vdata to the driving transistor DRT, and a storage capacitor Cst for maintaining voltage for a certain period, and the like.

The light emitting element ED may include an anode electrode AE and a cathode electrode CE, and a light emitting layer EL positioned between the anode electrode AE and the cathode electrode EC. For example, the light emitting element ED may be an organic light emitting diode (OLED), a light emitting diode (LED), a quantum dot light emitting device, or the like.

The cathode electrode CE of the light emitting element ED may be a common electrode. In this case, a base voltage EVSS may be applied to the cathode electrode CE of the light emitting element ED. Here, for example, the base voltage EVSS may be a ground voltage or a voltage similar to the ground voltage.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected to a source node or a drain node of the scan transistor SCT. The second node N2 of the driving transistor DRT may be electrically connected to the anode electrode AE of the light emitting element ED, and may be a source node or a drain node of the driving transistor DRT. The third node N3 of the driving transistor DRT may be electrically connected to a driving voltage line DVL that supplies the driving voltage EVDD, and may be a drain node or a source node of the driving transistor DRT.

The scan transistor SCT can control the connection between the first node N1 of the driving transistor DRT and the corresponding data line DL in response to the scan signal SCAN supplied from the gate line GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the gate line GL to receive a scan signal SCAN through the gate line GL.

When the scan transistor SCT is turned on by the scan signal SCAN of the turn-on level voltage, the scan transistor SCT may transfer the image data voltage Vdata supplied from the corresponding data line DL to the first node N1 of the driving transistor DRT.

The scan transistor SCT is turned on by the scan signal SCAN of the turn-on level voltage, and is turned off by the scan signal SCAN of the turn-off level voltage. Here, when the scan transistor SCT is n-type, the turn-on level voltage may be a high-level voltage, and the turn-off level voltage may be a low-level voltage. When the scan transistor SCT is p-type, the turn-on level voltage may be a low-level voltage and the turn-off level voltage may be a high-level voltage.

The storage capacitor Cst may be electrically connected between the first node N1 and the second node N2 of the driving transistor DRT. The storage capacitor Cst may maintain the image data voltage Vdata corresponding to the image signal voltage or a voltage corresponding thereto for one frame time.

The storage capacitor Cst is an intentionally designed external capacitor, not a parasitic capacitor that is an internal capacitor (e.g., Cgs, Cgd) existing between the first node N1 and the second node N2 of the driving transistor DRT.

Each of the driving transistor DRT and the scan transistor SCT may be an n-type transistor or a p-type transistor. Both the driving transistor DRT and the scan transistor SCT may be n-type transistors or p-type transistors. At least one of the driving transistor DRT and the scan transistor SCT may be an n-type transistor (or p-type transistor) and the other may be a p-type transistor (or n-type transistor).

Each subpixel structure illustrated in FIG. 4 is only an example for description. Each subpixel may further include one or more transistors and/or one or more capacitors. Each of the plurality of sub-pixels may have the same structure, or some of the plurality of sub-pixels may have a different structure.

Figure 5:
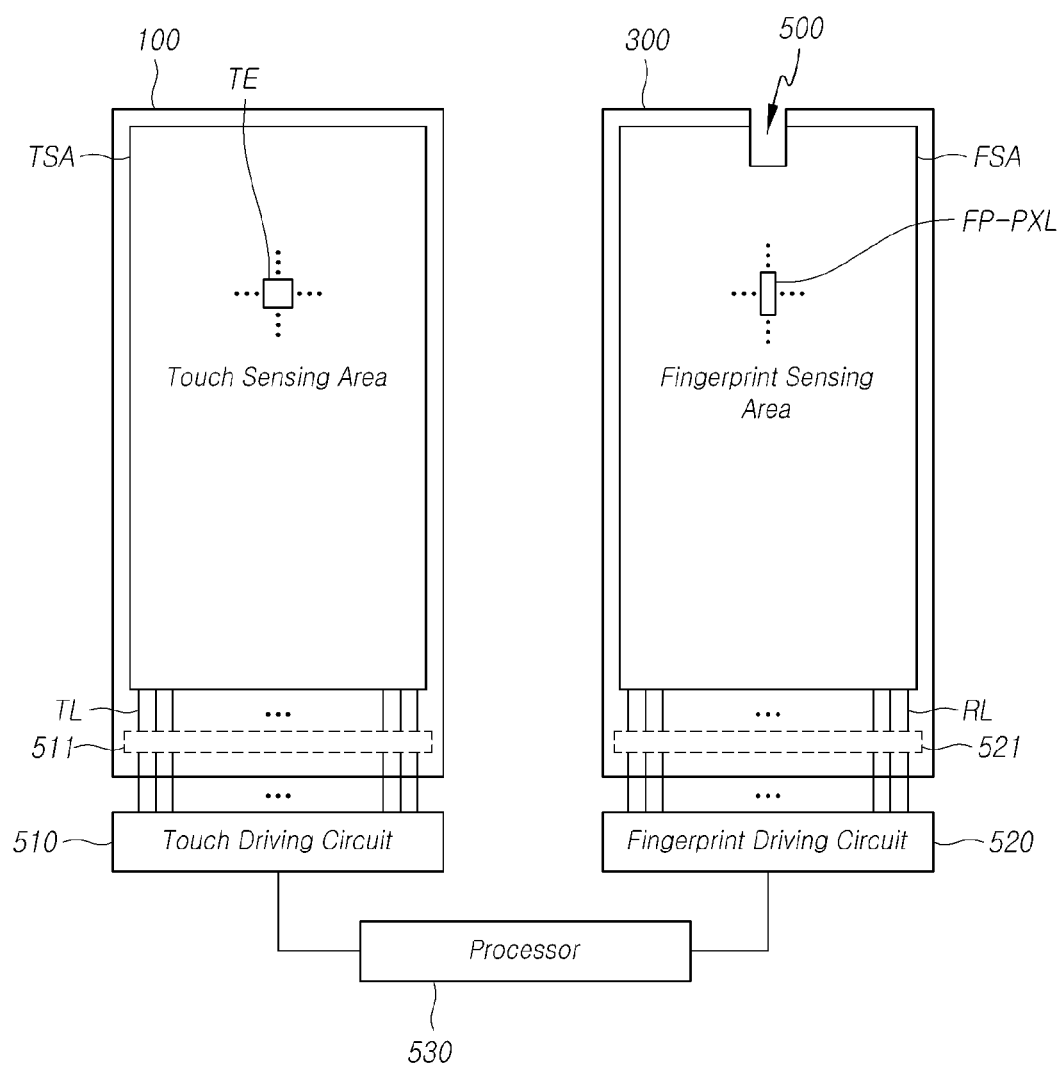
FIG. 5 is a configuration diagram of a touch sensing part and a fingerprint sensing part of the display device according to embodiments of the present disclosure.

FIG. 5 is a configuration diagram of a touch sensing part and a fingerprint sensing part of the display device 10 according to embodiments of the present disclosure.

Referring to FIG. 5, the display device 10 according to embodiments of the present disclosure may include a touch sensing part that senses a touch caused by a touch pointer or senses a touch position where the touch pointer touches the display panel 100. Here, the touch pointer may be a finger or a pen. When the touch pointer touches the display panel 100, the touch pointer may touch the display panel 100 in a contact manner, or the touch pointer may touch the display panel 100 in a non-contact manner (also called hover mode method). The touch sensing part may include the display panel 100 with touch sensors, a touch driving circuit 510 driving and sensing a touch sensor to output touch sensing data, and a processor 530 that recognizes a touch event or acquires a touch position using touch sensing data.

The touch sensor embedded in the display panel 100 may include a plurality of touch electrodes TE disposed in the touch sensing area TSA of the display panel 100. Here, the touch sensing area TSA may correspond to the display area AA.

The display panel 100 may include a plurality of touch electrodes TE and a plurality of touch lines TL. The display panel 100 may further include a touch pad unit 511 disposed in the non-display area NA and electrically connected to the touch driving circuit 510. Each of the plurality of touch lines TL can electrically connect the corresponding touch electrode TE among the plurality of touch electrodes TE to the touch pad unit 511.

The touch pad unit 511 may be positioned on the transparent substrate 320 and may be located in the non-display area NA, which may be an outer area of the display area AA. The plurality of touch lines TL may be electrically connected to all or part of the plurality of touch electrodes TE. The plurality of touch lines TL may descend along the inclined surface of the encapsulation layer 350 and be electrically connected to the touch pad unit 511.

The touch driving circuit 510 may drive all or part of the plurality of touch electrodes TE and sense all or part of the plurality of touch electrodes TE to generate touch sensing data. The touch driving circuit 510 may supply the generated touch sensing data to the processor 530.

The processor 530 may recognize a touch occurrence or determine a touch location based on the touch sensing data. The processor 530 may perform a predetermined function (e.g., input processing, object selection processing, writing processing, etc.) based on the recognized touch occurrence or the determined touch position.

The touch driving circuit 510 and the data driving circuit 420 may be implemented as separate integrated circuits. Alternatively, the touch driving circuit 510 and the data driving circuit 420 may be integrated into one integrated circuit.

Referring to FIG. 5, a fingerprint sensing part of the display device 10 according to embodiments of the present disclosure is a part for sensing a user's fingerprint. The fingerprint sensing part may include a fingerprint sensor panel 300 in which a plurality of fingerprint sensing pixels FP-PXL may be arranged, a fingerprint driving circuit 520 driving and sensing the fingerprint sensor panel 300 to output fingerprint sensing data, and a processor 530 recognizing a fingerprint using fingerprint sensing data and performing a predetermined function (e.g., user authentication) according to a fingerprint recognition result.

The fingerprint sensing part of the display device 10 according to embodiments of the present disclosure may sense a fingerprint by an optical method, an ultrasonic method, or the like. In the following, the fingerprint sensing part of the display device 10 may be an example of sensing a fingerprint by an ultrasonic method.

The fingerprint sensing pixels FP-PXL included in the fingerprint sensor panel 300 may be disposed in the fingerprint sensing area FSA. Here, the fingerprint sensing area FSA may correspond to the display area AA.

Each of the plurality of fingerprint sensing pixels FP-PXL may include a piezoelectric element, a driving unit (transmission unit), and a sensing unit (reception unit). The piezoelectric element may include a driving electrode, a piezoelectric material layer, and a common electrode. The driving unit drives the piezoelectric element to generate ultrasonic waves in the piezoelectric element. The ultrasonic waves generated by the piezoelectric element may be reflected from the fingerprint portion (ridge, valley) of the finger. The ultrasonic reflection characteristics at the ridge and the ultrasonic reflection characteristics at the valley may be different. The sensing unit generates a signal according to the ultrasound waves reflected from the fingerprint portion of the finger, and senses the generated signal. Here, each of the driving unit (transmission unit) and the sensing unit (reception unit) may include one or more switching elements (transistors).

A signal (AC signal) having a variable voltage level may be applied to one of the driving electrode and a common electrode, and a signal (DC signal) having a constant voltage level may be applied to the other.

A fingerprint pad unit 521 to which the fingerprint driving circuit 520 may be electrically connected may exist on the outer side of the fingerprint sensing area FSA of the fingerprint sensor panel 300.

The fingerprint sensor panel 300 may include a plurality of read-out lines RL that electrically connect each sensing unit (reception unit) of the plurality of fingerprint sensing pixels FP-PXL to the fingerprint pad unit 521.

The fingerprint driving circuit 520 may drive all or part of the plurality of fingerprint sensing pixels FP-PXL and sense all or part of the plurality of fingerprint sensing pixels FP-PXL. The fingerprint driving circuit 520 may generate fingerprint sensing data according to the sensing result, and supply the generated fingerprint sensing data to the processor 530.

The processor 530 may recognize the fingerprint based on the fingerprint sensing data, and perform a predetermined function (e.g., user authentication, etc.) according to the fingerprint recognition result.

Meanwhile, referring to FIG. 5, the fingerprint sensor panel 300 may have a hole or notch groove 500 in a portion corresponding to the first area A1.

Hereinafter, the structure of the touch sensor in the display panel 100 will be described with reference to FIGS. 6 to 10. The display device 10 according to embodiments of the present disclosure may sense a touch in a capacitance method.

Figure 6:
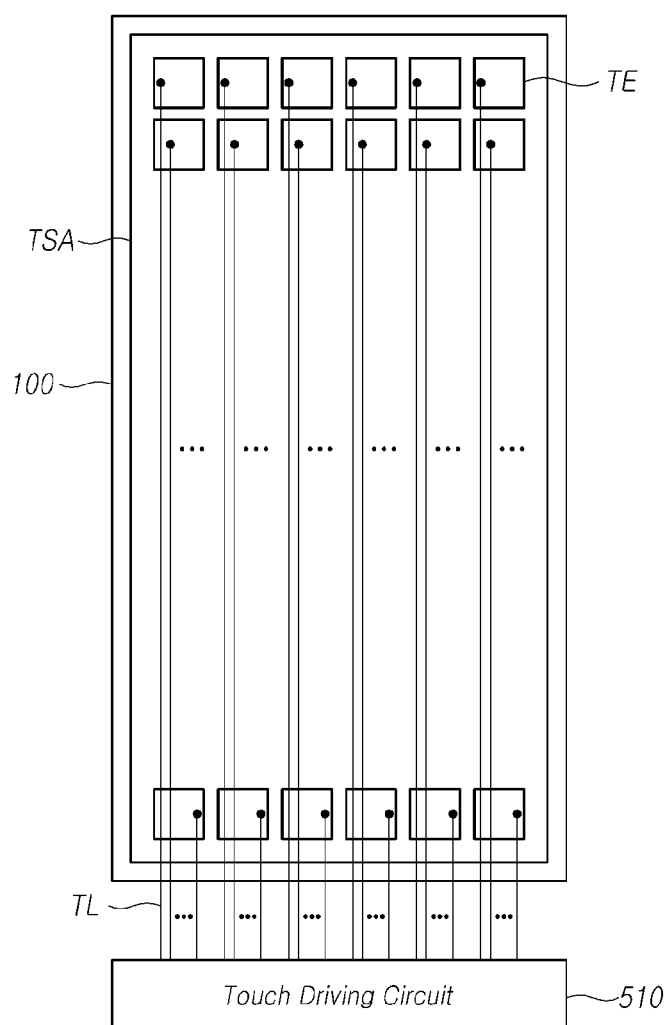
FIG. 6 is an exemplary view illustrating a structure of the touch sensor in the display panel of the display device according to embodiments of the present disclosure.

FIG. 6 is an exemplary view illustrating a structure of the touch sensor in the display panel 100 of the display device 10 according to embodiments of the present disclosure.

Referring to FIG. 6, each of the plurality of touch electrodes TE disposed in the touch sensing area TSA of the display panel 100 may be separated from each other and may be a block electrode. Each of the plurality of touch electrodes TE may not overlap each other.

Each of the plurality of touch electrodes TE may be electrically connected to the touch driving circuit 510 through one or more touch lines TL.

The touch line TL may be disposed in parallel with the data line DL or in the same direction as the data line DL.

The plurality of touch electrodes TE may include first and second touch electrodes arranged in the same column. The first touch electrode may be located farther from the touch driving circuit 510 than the second touch electrode. The plurality of touch lines TL may include a first touch line connected to the first touch electrode and a second touch line connected to the second touch electrode.

The first touch line connected to the first touch electrode may overlap the second touch electrode, but may not be electrically connected to the second touch electrode.

The first touch electrode and the second touch electrode may be separated in the display panel 100 and may be physically separated. The first touch line and the second touch line may be separated within the display panel 100 and may be physically separated. The first touch electrode and the second touch electrode may be separated in the display panel 100, but may be electrically connected by a switching circuit in the touch driving circuit 510 depending on driving conditions.

The touch sensor structure illustrated in FIG. 6 may be suitable for a self-capacitance based touch sensing method that senses a touch using a capacitance between a touch electrode TE and a touch pointer (e.g., finger, pen, etc.).

Accordingly, the touch driving circuit 510 supplies a touch driving signal to one or more of the plurality of touch electrodes TE, and detects a touch sensing signal from the touch electrode TE to which the touch driving signal may be applied. The touch driving circuit 510 may acquire a sensing value for each touch electrode TE based on the detection of the touch sensing signal, and generate touch sensing data including the obtained sensing value.

Figure 7:
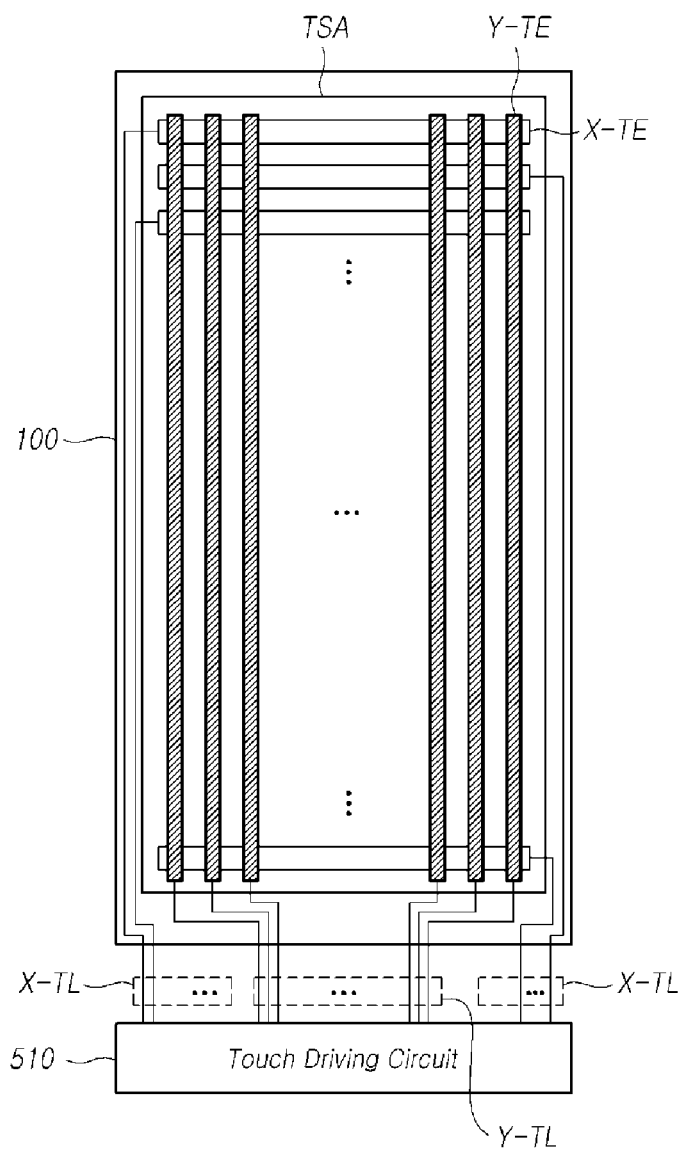
FIG. 7 is another exemplary view of a structure of the touch sensor in the display panel of the display device according to embodiments of the present disclosure.

FIG. 7 is another exemplary view of a structure of the touch sensor in the display panel 100 of the display device 10 according to embodiments of the present disclosure.

The touch sensor structure illustrated in FIG. 7 may be suitable for a mutual-capacitance-based touch sensing method that senses a touch using a capacitance between two touch electrodes TE.

Referring to FIG. 7, for a touch sensing method based on mutual-capacitance, the plurality of touch electrodes TE disposed in the touch sensing area TSA of the display panel 100 may include a plurality of first touch electrodes X-TE and a plurality of second touch electrodes Y-TE. The plurality of first touch electrodes X-TE and the plurality of second touch electrodes Y-TE may be disposed in different directions. Mutual-capacitance may be formed between the first touch electrode X-TE and the second touch electrode Y-TE.

The plurality of first touch electrodes X-TE and the plurality of second touch electrodes Y-TE may cross each other. The point (area) at which the first touch electrode X-TE and the second touch electrode Y-TE intersect each other may be called a touch node.

The plurality of first touch electrodes X-TE may be driving electrodes (or transmitting electrodes) to which a touch driving signal is supplied from the touch driving circuit 510, and the plurality of second touch electrodes Y-TE may be sensing electrodes (or receiving electrodes) sensed by the touch driving circuit 510.

On the contrary, the plurality of first touch electrodes X-TE may be sensing electrodes (or receiving electrodes) sensed by the touch driving circuit 510, and the plurality of second touch electrodes Y-TE may be driving electrodes (or transmitting electrodes) to which a touch driving signal is supplied from the touch driving circuit 510.

Figure 8:
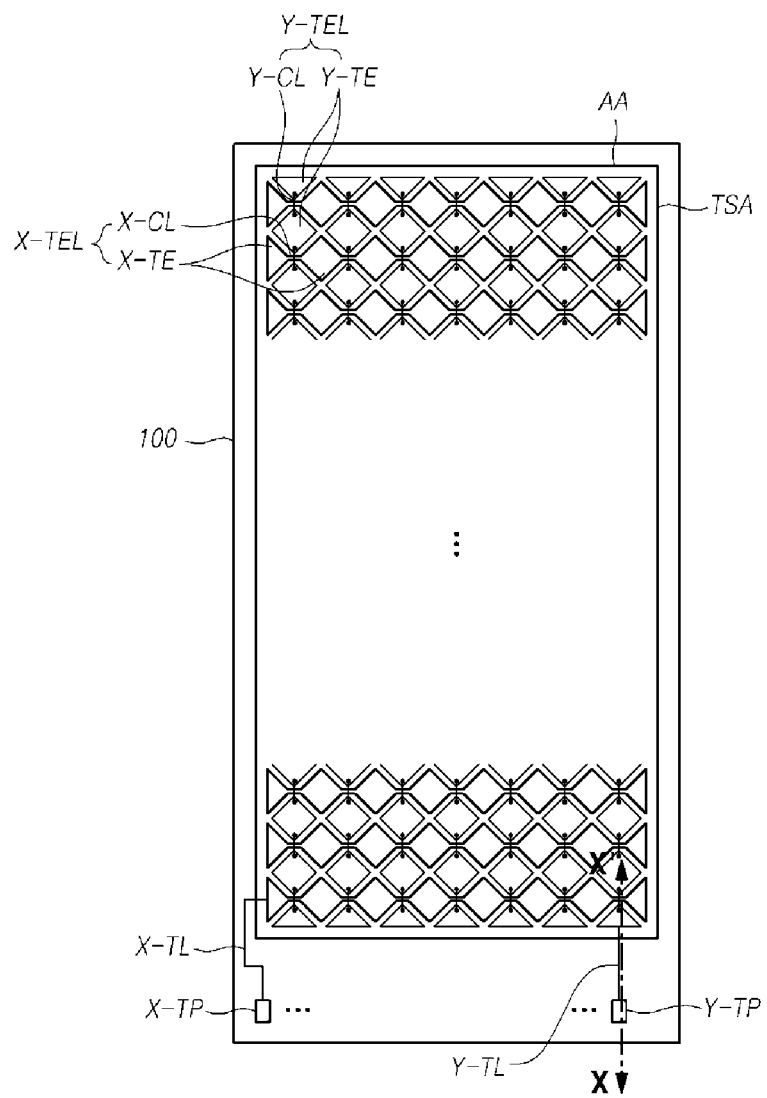
FIG. 8 is another exemplary view of a structure of the touch sensor in the display panel of the display device according to embodiments of the present disclosure.

FIG. 8 is another exemplary view of a structure of the touch sensor in the display panel 100 of the display device 10 according to embodiments of the present disclosure.

FIG. 8 is a touch sensor structure for mutual-capacitance based touch sensing and is an example different from FIG. 7. However, the touch sensor structure of FIG. 8 is an electrical equivalent structure to the touch sensor structure of FIG. 7.

Referring to FIG. 8, the plurality of touch electrodes TE disposed in the touch sensing area TSA of the display panel 100 may include a plurality of first touch electrodes X-TE and a plurality of second touch electrodes Y-TE. The first touch electrodes X-TE disposed in the same row among the plurality of first touch electrodes X-TE may be electrically connected by the first bridge pattern X-CL. The second touch electrodes Y-TE disposed in the same column among the plurality of second touch electrodes Y-TE may be electrically connected by the second bridge pattern Y-CL.

The first touch electrodes X-TE disposed in the same row and positioned on the same layer and the first bridge pattern X-CL connecting them may be all integrally formed and may be located on the same layer.

The second touch electrodes Y-TE disposed in the same column and positioned on the same layer, and the second bridge pattern Y-CL connecting them, may be located on different layers and may be electrically connected through contact holes.

The first touch electrodes X-TE disposed in the same row and electrically connected by the first bridge pattern X-CL form one first touch electrode line X-TEL. The first touch electrode line X-TEL formed in this way may be electrically the same as the first touch electrode X-TE in FIG. 7. The second touch electrodes Y-TE disposed in the same column and electrically connected by the second bridge pattern Y-CL form one second touch electrode line Y-TEL. The second touch electrode line Y-TEL formed as described above may be electrically the same as the second touch electrode Y-TE in FIG. 7.

Each of the plurality of first touch electrode lines X-TEL may be electrically connected to one or more first touch lines X-TL. Each of the plurality of second touch electrode lines Y-TEL may be electrically connected to one or more second touch lines Y-TL.

Each of the plurality of first touch electrode lines X-TEL may be electrically connected to the first touch pad X-TP included in the touch pad unit 510 through one or more first touch lines X-TL. Each of the plurality of second touch electrode lines Y-TEL may be electrically connected to the second touch pad Y-TP included in the touch pad unit 510 through one or more second touch lines Y-TL.

Figure 9:
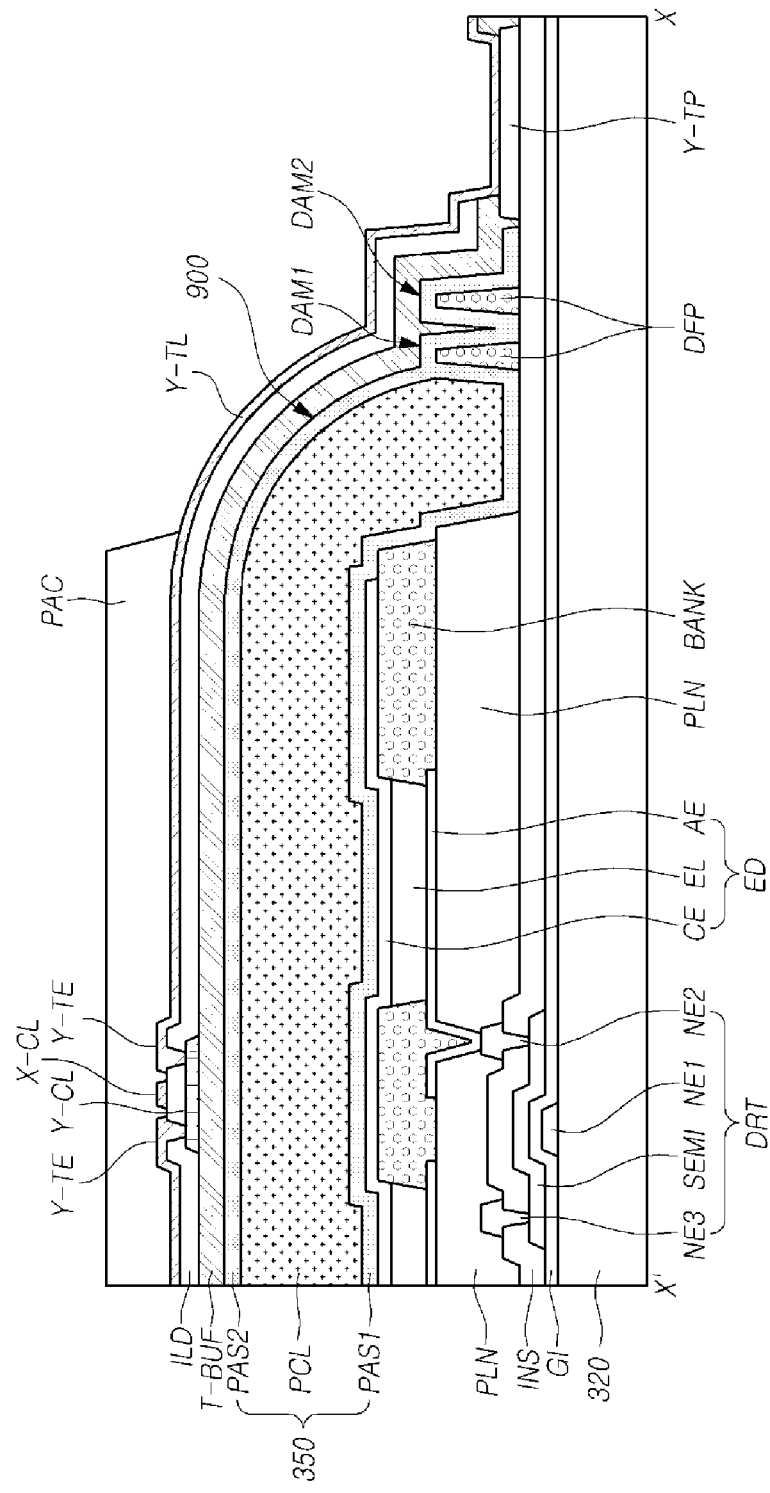
FIG. 9 is a cross-sectional view of the display panel of the display device according to embodiments of the present disclosure.

FIG. 9 is a cross-sectional view of the display panel 100 of the display device 10 according to embodiments of the present disclosure.

The driving transistor DRT in each subpixel SP in the display area AA may be disposed over the transparent substrate 320.

The driving transistor DRT may include a first node electrode NE1 corresponding to a gate electrode, a second node electrode NE2 corresponding to a source electrode or a drain electrode, and a third node electrode NE3 corresponding to a drain electrode or a source electrode. The driving transistor DRT further may include a semiconductor layer SEMI or the like.

The gate insulating layer GI may be positioned between the first node electrode NE1 and the semiconductor layer SEMI. The first node electrode NE1 and the semiconductor layer SEMI may overlap each other. The second node electrode NE2 may be formed on the insulating layer INS and may be connected to one side of the semiconductor layer SEMI through a contact hole. The third node electrode NE3 may be formed on the insulating layer INS and may be connected to the other side of the semiconductor layer SEMI through a contact hole.

The light emitting element ED may include the anode electrode AE corresponding to the pixel electrode, the light emitting layer EL formed on the anode electrode AE, and the cathode electrode CE formed on the emission layer EL and corresponding to the common electrode.

The anode electrode AE may be electrically connected to the second node electrode NE2 of the driving transistor DRT exposed through the pixel contact hole passing through the planarization layer PLN.

The emission layer EL may be formed on the anode electrode AE of the emission area provided (exposed) by the bank BANK. The light emitting layer EL may have a stack structure including a hole related layer, a light emitting layer, and an electron related layer. The cathode electrode CE may be formed to face the anode electrode AE with the light emitting layer EL interposed therebetween.

The light emitting element ED may be vulnerable to moisture or oxygen. The encapsulation layer 350 may prevent the light emitting element ED from being exposed to moisture or oxygen. That is, the encapsulation layer 350 may reduce the penetration of moisture or oxygen. The encapsulation layer 350 may be a single layer, but may be composed of a plurality of layers (PAS1, PCL, and PAS2) as shown in FIG. 9.

For example, when the encapsulation layer 350 is composed of a plurality of layers (PAS1, PCL, PAS2), the encapsulation layer 350 may include at least one inorganic encapsulation layer (PAS1, PAS2) and at least one organic encapsulation layer PCL. As a specific example, the encapsulation layer 350 may have a structure in which the first inorganic encapsulation layer PAS1, the organic encapsulation layer PCL, and the second inorganic encapsulation layer PAS2 may be sequentially stacked.

Here, the organic encapsulation layer PCL may further include at least one organic encapsulation layer or at least one inorganic encapsulation layer.

The first inorganic encapsulation layer PAS1 may be disposed on the cathode electrode CE and may be disposed closest to the light emitting element ED. The first inorganic encapsulation layer PAS1 may be formed of an inorganic insulating material capable of low-temperature deposition. For example, the first inorganic encapsulation layer PAS1 may be silicon nitride ($SiN_x$), silicon oxide ($SiO_x$), silicon oxynitride (SiON), or aluminum oxide ($Al_2O_3$). Since the first inorganic encapsulation layer PAS1 may be deposited in a low temperature atmosphere, during the deposition process, the first inorganic encapsulation layer PAS1 may reduce damage of the light emitting layer EL including the organic material due to vulnerability to a high temperature atmosphere.

The organic encapsulation layer PCL may be formed with a smaller area than the first inorganic encapsulation layer PAS1. In this case, the organic encapsulation layer PCL may be formed to expose both ends of the first inorganic encapsulation layer PAS1. The organic encapsulation layer PCL may serve as a buffer for alleviating stress between layers due to bending of the touch display device, which is an organic light emitting display device, and may also serve to enhance flattening performance. For example, the organic encapsulation layer PCL may be acrylic resin, epoxy resin, polyimide, polyethylene, or Silicon oxycarbon (SiOC), and may be formed of an organic insulating material. For example, the organic encapsulation layer PCL may be formed through an inkjet method.

The display panel 100 may further include one or more dams (DAM1, DMA2) formed to prevent the encapsulation layer 350 from collapsing.

The one or more dams DAM1 and DMA2 may exist at or near the boundary of the display area AA and the non-display area NA. For example, the one or more dams DAM1 and DMA2 may be located at or near the end point of the slope 900 of the encapsulation layer 350.

One or more dams DAM1 and DMA2 may be disposed between the touch pad unit 511 including the touch pad Y-TP and the display area AA. The one or more dams DAM1 and DMA2 may be formed of a dam forming pattern DFP or the like. For example, the dam forming pattern DFP may include the same material as the bank BANK.

The one or more dams DAM1 and DMA2 may be located only in the non-display area NA. Alternatively, most of the one or more dams DAM1 and DMA2 exist in the non-display area NA, but a portion of the one or more dams DAM1 and DMA2 may span the display area AA.

When the display panel 100 is formed with two or more dams (DAM1, DMA2) to reduce the likelihood of the sealing layer 350 from collapsing, the dam located closest to the display area AA may be called the primary dam DAM1. After the primary dam, a dam located close to the display area AA may be called a secondary dam DAM2. The primary dam DAM1 may be positioned relatively closer to the display area AA than the secondary dam DAM2. The secondary dam DAM2 may be positioned relatively closer to the touch pad unit 511 than the primary dam DAM1.

When the liquid form organic encapsulation layer PCL is dropped on the display area AA, the liquid form organic encapsulation layer PCL may collapse in the direction of the non-display area NA. The collapsed organic encapsulation layer PCL may invade the pad area and cover the touch pad unit 511 or the like. The collapse of the organic encapsulation layer PCL can be reduced by one or more dams (DAM1, DMA2). This may be larger when two or more dams DAM1 and DAM2 may be formed, as illustrated in FIG. 9.

The primary dam DAM1 and/or the secondary dam DAM2 may be formed in a single layer or multi-layer structure.

The primary dam DAM1 and/or the secondary dam DAM2 may be basically made of a dam forming pattern DFP. The dam forming pattern DFP may have a higher height than the touch pad Y-TP disposed on the touch pad unit 511.

The dam formation pattern DFP may be formed of the same material as the bank BANK for separating the sub-pixels SP from each other, or may be formed of the same material as a spacer for maintaining the interlayer spacing. In this case, the dam formation pattern DFP may be formed simultaneously with a bank BANK or a spacer. Accordingly, a dam structure can be formed without an additional mask and cost increase.

Referring to FIG. 9, The primary dam DAM1 and/or the secondary dam DAM2 has a multi-layer structure in which the first inorganic encapsulation layer PAS1 and/or the second inorganic encapsulation layer PAS2 may be stacked on the dam formation pattern DFP.

The organic encapsulation layer PCL containing the organic material may be located only on the inner side of the innermost primary dam DAM1. That is, the organic encapsulation layer PCL may not be present on all dams DAM1 and DAM2. Alternatively, the organic encapsulation layer PCL including an organic material may be positioned on at least the primary dam DAM1 of the primary dam DAM1 and the secondary dam DAM2. That is, the organic encapsulation layer PCL can be located extending to only the upper portion of the primary dam DAM1. Alternatively, the organic encapsulation layer PCL may be positioned to extend beyond the upper portion of the primary dam DAM1 to the upper portion of the secondary dam DAM2.

The second inorganic encapsulation layer PAS2 may be formed to cover the top and side surfaces of the organic encapsulation layer PCL and the first inorganic encapsulation layer PAS1 on the transparent substrate 320 on which the organic encapsulation layer PCL may be formed. The second inorganic encapsulation layer PAS2 can reduce or block external moisture or oxygen from penetrating into the first inorganic encapsulation layer PAS1 and the organic encapsulation layer PCL. For example, the second inorganic encapsulation layer PAS2 may be formed of an inorganic insulating material such as silicon nitride ($SiN_x$), silicon oxide ($SiO_x$), silicon oxynitride (SiON), or aluminum oxide ($Al_2O_3$).

A touch buffer layer T-BUF may be disposed on the encapsulation layer 350.

The first and second touch electrodes X-TE and Y-TE and the first and second bridge patterns X-CL and Y-CL may be positioned on the touch buffer layer T-BUF.

All or part of each of the first and second touch lines X-TL and Y-TL may also be positioned on the touch buffer layer T-BUF.

The touch buffer layer T-BUF may be positioned between the touch electrodes X-TE and Y-TE and the cathode electrode CE. By the touch buffer layer T-BUF, the separation distance between the touch electrodes X-TE and Y-TE and the cathode electrode CE of the light emitting element ED can be equal to or greater than a predetermined minimum separation distance (e.g., 5 μm) or be a predetermined optimum separation distance. Accordingly, parasitic capacitance between the touch electrodes X-TE and Y-TE and the cathode electrode CE may be reduced or prevented. Therefore, a decrease in touch sensitivity due to parasitic capacitance can be reduced.

The touch buffer layer T-BUF may not be present on the encapsulation layer 350. That is, the touch buffer layer T-BUF may not be disposed between the encapsulation layer 350 and the touch sensor metal layer. Here, the touch sensor metal layer may include first touch electrodes X-TE, second touch electrodes Y-TE, a first bridge pattern X-CL, a second bridge pattern Y-CL, and the like.

In the manufacturing process of the touch sensor metal, chemicals (developer or etchant, etc.) used in the process or moisture from the outside may occur. By arranging the touch buffer layer T-BUF and disposing a touch sensor metal thereon, it may be possible to reduce penetration of the chemical liquid or moisture into the light emitting layer EL containing the organic material during the manufacturing process of the touch sensor metal. Accordingly, the touch buffer layer T-BUF can reduce damage to the light emitting layer EL, which may be susceptible to chemicals or moisture.

The touch buffer layer T-BUF may be formed of an organic insulating material having a low dielectric constant (e.g., 1~3 dielectric constant) and formed at a low temperature below a certain temperature (e.g., 100 degrees (° C.)) in order to reduce damage to the light emitting layer EL containing an organic material vulnerable to high temperatures. For example, the touch buffer layer T-BUF may be formed of an acrylic-based, epoxy-based, or siloxane-based material. As the organic light emitting display device is bent, each encapsulation layer (PAS1, PCL, PAS2) in the encapsulation layer 350 may be damaged, and the touch sensor metal positioned on the touch buffer layer T-BUF may be broken. Even if the organic light emitting display device is bent, the touch buffer layer T-BUF having a flattening performance with an organic insulating material may prevent damage to the encapsulation layer 350 and/or cracks in the touch sensor metal.

According to the mutual-capacitance-based touch sensor structure, the first touch electrode line X-TEL and the second touch electrode line Y-TEL may be disposed on the touch buffer layer T-BUF, and the first touch electrode line X-TEL and the second touch electrode line Y-TEL may be arranged to cross.

The second touch electrode line Y-TEL may include a plurality of second touch electrodes Y-TE. The second touch electrode line Y-TEL may further include a plurality of second bridge patterns Y-CL that electrically connect the plurality of second touch electrodes Y-TE. As illustrated in FIG. 9, the plurality of second touch electrodes Y-TE and the plurality of second bridge patterns Y-CL may be positioned on different layers with the touch insulating layer ILD therebetween.

Referring to FIGS. 8 and 9 together, the plurality of second touch electrodes Y-TE disposed in the same column may be spaced apart at regular intervals along the y-axis direction (column direction). Each of the plurality of second touch electrodes Y-TE may be electrically connected to another second touch electrode Y-TE adjacent in the y-axis direction through the second bridge pattern Y-CL.

The second bridge pattern Y-CL may be formed on the touch buffer layer T-BUF. The second bridge pattern Y-CL may be exposed through a touch contact hole passing through the touch insulating layer ILD and electrically connected to two second touch electrodes Y-TE adjacent in the y-axis direction.

The second bridge pattern Y-CL may be disposed to overlap the bank BANK. Accordingly, it may be possible to prevent the aperture ratio from being lowered by the second bridge pattern Y-CL.

Referring to FIGS. 8 and 9 together, the first touch electrode line X-TEL may include a plurality of first touch electrodes X-TE. The first touch electrode line X-TEL may further include a plurality of first bridge patterns X-CL that electrically connect the plurality of first touch electrodes X-TE. The plurality of first touch electrodes X-TE and the plurality of first bridge patterns X-CL may be positioned on different layers with the touch insulating layer ILD therebetween. Alternatively, the plurality of first bridge patterns X-CL and the plurality of first touch electrodes X-TE may be integrally formed and may be located on the same layer.

Referring to FIGS. 8 and 9 together, the plurality of first touch electrodes X-TE disposed in the same row may be spaced apart at regular intervals along the x-axis direction (row direction) on the touch insulating layer ILD. Each of the plurality of first touch electrodes X-TE may be electrically connected to another first touch electrode X-TE adjacent in the x-axis direction through the first bridge pattern X-CL.

The first bridge pattern X-CL may be disposed on the same plane as the first touch electrode X-TE and may be electrically connected to two first touch electrodes X-TE adjacent in the x-axis direction without a separate contact hole. Alternatively, the first bridge pattern X-CL may be integral with two first touch electrodes X-TE adjacent in the x-axis direction.

The first bridge pattern X-CL may be disposed to overlap the bank BANK. Accordingly, it may be possible to reduce the aperture ratio from being lowered by the first bridge pattern X-CL.

Referring to FIG. 9, the second touch electrode line Y-TEL can be electrically connected to the second touch pad Y-TP included in touch pad unit 511 in the first non-display area NA1 through the second touch line Y-TL. The second touch pad Y-TP may be electrically connected to the touch driving circuit 510.

Similar to this structure, the first touch electrode line X-TEL can be electrically connected to the first touch pad X-TP included in touch pad unit 511 in the first non-display area NA1 through the first touch line X-TL. The first touch pad X-TP may be electrically connected to the touch driving circuit 510.

The touch pad unit 511 may further include a pad cover electrode covering the first touch pad X-TP and the second touch pad Y-TP.

The first touch pad X-TP may be formed separately from the first touch line X-TL or may be formed by extending the first touch line X-TL. The second touch pad Y-TP may be formed separately from the second touch line Y-TL or may be formed by extending the second touch line Y-TL.

When the first touch pad X-TP is formed by extending the first touch line X-TL, and the second touch pad Y-TP is formed by extending the second touch line Y-TL, the first touch pad X-TP, the first touch line X-TL, the second touch pad Y-TP, and the second touch line Y-TL may include the same one or more first conductive materials and may be formed in a single layer or multilayer structure. For example, the first conductive material may include Al, Ti, Cu, Mo, and the like, and may be a metal having strong corrosion resistance, strong acid resistance, and good conductivity.

For example, each of the first touch pad X-TP, the first touch line X-TL, the second touch pad Y-TP, and the second touch line Y-TL may include the first conductive materials, and may be formed of a three-layer stacked structure, such as Ti/Al/Ti or Mo/Al/Mo.

The pad cover electrode capable of covering the first touch pad X-TP and the second touch pad Y-TP may include one or more second conductive materials. The second conductive material may include a transparent conductive material (e.g., ITO, IZO, etc.) having strong corrosion resistance and strong acid resistance. The pad cover electrode may be formed to be exposed by the touch buffer layer T-BUF to be bonded to the touch driving circuit 510 or to a circuit film on which the touch driving circuit 510 may be mounted. The second conductive material may also be included in the first and second touch electrodes X-TE and Y-TE.

The touch buffer layer T-BUF may be formed to cover the touch sensor metal the encapsulation layer 350, thereby preventing the touch sensor metal the light emitting elements (e.g., OLED (Organic Light Emitting Diode), etc.) under the encapsulation layer 350 from being corroded by moisture or the like. For example, the touch buffer layer T-BUF may be formed of an organic insulating material, or may be formed of a circular polarizing plate or a film of epoxy or acrylic material. The touch buffer layer T-BUF may not be on the encapsulation layer 350. That is, the touch buffer layer T-BUF may not be an essential configuration.

The second touch line Y-TL may be electrically connected to the second touch electrode Y-TE through a contact hole, or may be integrally formed with the second touch electrode Y-TE.

The second touch line Y-TL electrically connects the second touch electrode Y-TE of the display area AA and the second touch pad Y-TP of the first non-display area NA1. A line portion of the second touch line Y-TL extended to the first non-display area NA1 may include a first line portion disposed along the inclined surface 900 of the encapsulation layer 350, a second line portion disposed on the one or more dams DAM1 and DAM2, and a third line portion electrically connected to the second touch pad Y-TP in the touch pad portion 511. The third line portion may be electrically connected to the touch driving circuit 510 through the second touch pad Y-TP. The first line portion may be closest to the display area AA, and the third line portion may be farthest from the display area AA.

The second touch line Y-TL may transfer a touch sensing signal from the second touch electrode Y-TE to the touch driving circuit 510 or may transfer the touch driving signal received from the touch driving circuit 510 to the second touch electrode Y-TE.

The first touch line X-TL may be electrically connected to the first touch electrode X-TE through a contact hole, or may be integrally formed with the first touch electrode X-TE.

The first touch line X-TL electrically connects the first touch electrode X-TE in the display area AA and the first touch pad X-TP in the first non-display area NA1. A line portion of the first touch line X-TL extended to the first non-display area NA1 may include a first line portion disposed along the inclined surface 900 of the encapsulation layer 350, a second line portion disposed on the one or more dams DAM1 and DAM2, and a third line portion electrically connected to the first touch pad X-TP in the touch pad portion 511. The third line portion may be electrically connected to the touch driving circuit 510 through the first touch pad X-TP. The first line portion may be closest to the display area AA, and the third line portion may be farthest from the display area AA.

The first touch line X-TL may transfer the touch driving signal received from the touch driving circuit 510 to the first touch electrode X-TE or may transfer a touch sensing signal from the first touch electrode X-TE to the touch driving circuit 510.

The arrangement of the first touch line X-TL and the second touch line Y-TL can be variously changed according to the panel design.

A touch protection layer PAC may be disposed on the first touch electrode X-TE and the second touch electrode Y-TE. The touch protection layer PAC may be extended to before or after the one or more dams DAM1 and DAM2, and may be disposed on the first touch line X-TL and the second touch line Y-TL.

Meanwhile, the cross-sectional view of FIG. 9 conceptually shows the structure, depending on the viewing direction or location, the position, thickness, or width of each pattern (various layers or various electrodes) may be changed, and the connection structure of various patterns may also be changed. In addition to the various layers shown, there may be additional layers, some of the various layers shown may be omitted or integrated. For example, the width of the bank BANK may be narrow compared to the width represented in FIG. 9, and the heights of the dams DAM1 and DAM2 may be lower or higher than the heights illustrated in FIG. 9.

Figure 10:
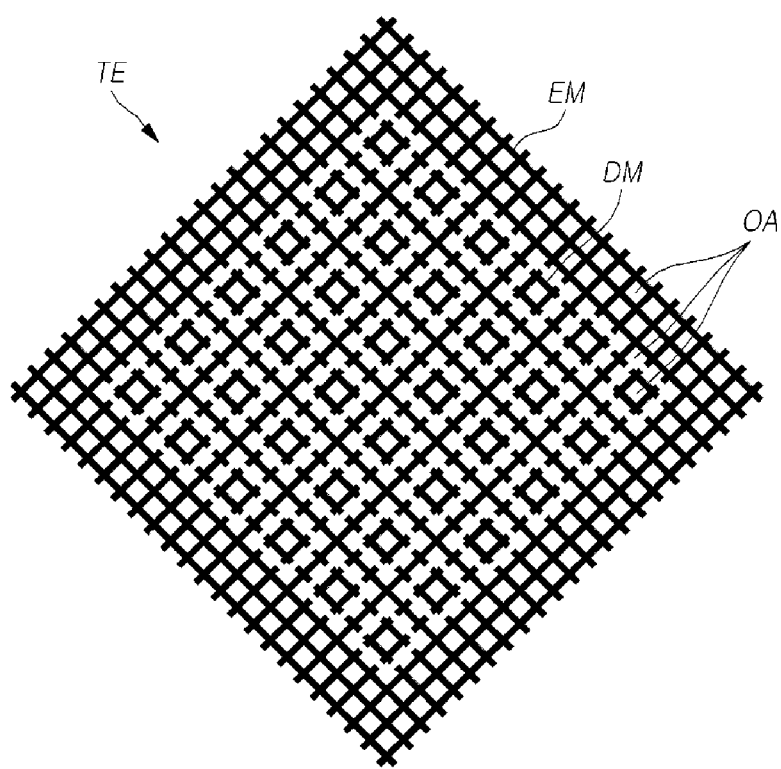
FIG. 10 is an exemplary view illustrating the touch electrode in the display panel of the display device according to embodiments of the present disclosure.

FIG. 10 is an exemplary view illustrating the touch electrode TE in the display panel 100 of the display device 10 according to embodiments of the present disclosure.

Referring to FIG. 10, each of the touch electrodes TE positioned in the first area A1 among the touch electrodes TE disposed inside the display panel 100 may be a mesh-type electrode having one or more openings or a mesh-type electrode. Each of the touch electrodes TE positioned in the first area A1 among the touch electrodes TE may be a transparent electrode or may include a transparent electrode.

As described above, since the touch electrode TE positioned in the first area A1 may be a mesh type or formed of a transparent electrode, the transmittance of the first area A1 may be increased. Accordingly, a shooting function of the camera 110 through the first area A1 and a sensing function of the proximity sensor 120 through the first area A1 may be enabled.

One touch electrode TE may be a transparent electrode without an opening (open area).

Alternatively, one touch electrode TE may be a mesh type having a plurality of open areas OA. That is, one touch electrode TE may be an electrode metal EM patterned in a mesh type to have a plurality of open areas OA. Here, the electrode metal EM may be one of the touch sensor metals.

Each of the plurality of open areas OA present on one touch electrode TE may correspond to the emission area of one or more subpixels SP. That is, the plurality of open areas OA serves as a path through which light emitted from the plurality of subpixels SP disposed under the touch electrode TE passes upward. The plurality of open areas OA present in each touch electrode TE disposed in the first area A1 may further improve transmittance in the first area A1.

In the touch electrode TE, the actual electrode part (that is, the electrode metal EM) excluding the plurality of open areas OA may be positioned on the bank BANK.

The method of forming the multiple touch electrodes TE is as follows. After the electrode metal EM is broadly formed in a mesh type in an area for forming a plurality of touch electrodes TE, the electrode metal EM is cut along a predetermined cutting line. Here, the predetermined cutting line corresponds to a boundary of a plurality of touch electrodes TE to be formed. After the cutting process, a plurality of separated electrode metals EM may be formed as a plurality of touch electrodes TE.

For example, the outer shape of the touch electrode TE may be a diamond shape, a rhombus shape, or a square shape, or may be various shapes such as a triangle, pentagon, or hexagon. The outer shape of the touch electrode TE is not limited to these examples and may be various shapes.

Referring to FIG. 10, in the area occupied by the mesh type touch electrode TE, one or more dummy metals DM may exist in a form separated from the mesh type electrode metal EM.

The electrode metal EM may be an electrode portion corresponding to the actual touch electrode TE, and may be an electrode where a touch driving signal may be applied or a touch sensing signal may be sensed. However, although the dummy metal DM may be present in the area of the touch electrode TE, the dummy metal DM may be a floating metal part in which the touch driving signal may not be applied and the touch sensing signal may not be detected. That is, the dummy metal DM may be an electrically floating and isolated metal.

Therefore, the electrode metal EM may be electrically connected to the touch driving circuit 510, but the dummy metal DM may not be electrically connected to the touch driving circuit 510.

In each area of all the touch electrodes TE, one or more dummy metals DM may exist in a state of being disconnected from the electrode metals EM. Alternatively, the one or more dummy metals DM may exist only in an area of some touch electrodes TE of all touch electrodes TE, and may not exist in areas of other touch electrodes TE.

Meanwhile, in relation to the role of dummy metal DM, when one or more dummy metals DM do not exist in the area of the touch electrode TE and only the electrode metal EM exists in a mesh type, visibility issues in which the outline of the electrode metal EM may be displayed on the screen may occur.

In comparison, when one or more dummy metals DM are present in the area of the touch electrode TE, visibility issues in which the outline of the electrode metal EM may be displayed on the screen may be prevented.

In addition, for each touch electrode TE, by controlling the existence or number of dummy metal DMs (dummy metal ratio), the effective electrode area that affects the size of the mutual-capacitance for each touch electrode TE may be adjusted. Through this, the size of the mutual-capacitance between the first touch electrode X-TE and the second touch electrode Y-TE may be adjusted to improve touch sensitivity.

On the other hand, by cutting some points from the electrode metal EM formed in the area of one touch electrode TE, the electrode metal parts falling off the original electrode metal EM can form the dummy metal DM. Therefore, the electrode metals EM and the dummy metal DM may be the same material formed on the same layer.

Figure 11:
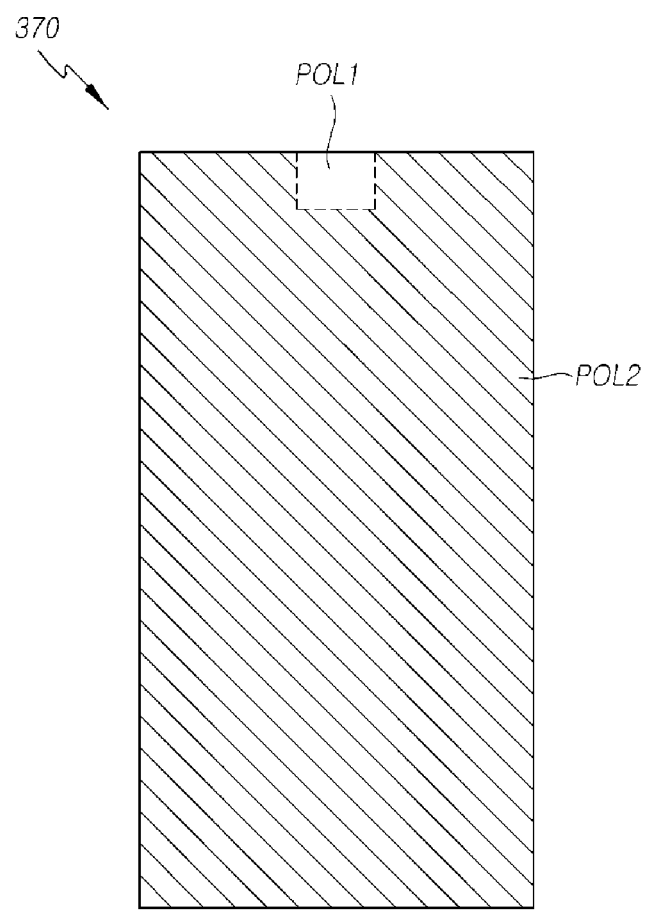
FIG. 11 is a view showing the polarizing plate in the display panel of the display device according to embodiments of the present disclosure.

FIG. 11 is a view showing the polarizing plate 370 in the display panel 100 of the display device 10 according to embodiments of the present disclosure.

Referring to FIG. 11, the polarizing plate 370 in the display panel 100 of the display device 10 according to embodiments of the present disclosure may include a first portion POL1 corresponding to the first area A1 and a second portion POL2 corresponding to the second area A2.

In the polarizing plate 370, the first portion POL1 may have a higher transmittance than the second portion POL2. The first portion POL1 may have a transmittance equal to or greater than a predetermined threshold transmittance. The second portion POL2 may have a transmittance less than a predetermined threshold transmittance. Here, the predetermined threshold transmittance may be a minimum transmittance that allows the functions of each of the camera 110 and the proximity sensor 120 to be normally performed.

As described above, since the first portion POL1 of the polarizing plate 370 may be formed with a high transmittance, the transmittance of the first area A1 corresponding to the first portion POL1 of the polarizing plate 370 may be increased. Accordingly, the shooting function of the camera 110 through the first area A1 and the sensing function of the proximity sensor 120 through the first area A1 may be normally performed.

Each of the optical transparent adhesive 380 and the cover glass 390 positioned on the polarizing plate 370 may have a transmittance equal to or greater than the predetermined threshold transmittance. Here, the predetermined threshold transmittance may be a minimum transmittance that allows the functions of each of the camera 110 and the proximity sensor 120 to be normally performed.

Figure 12:
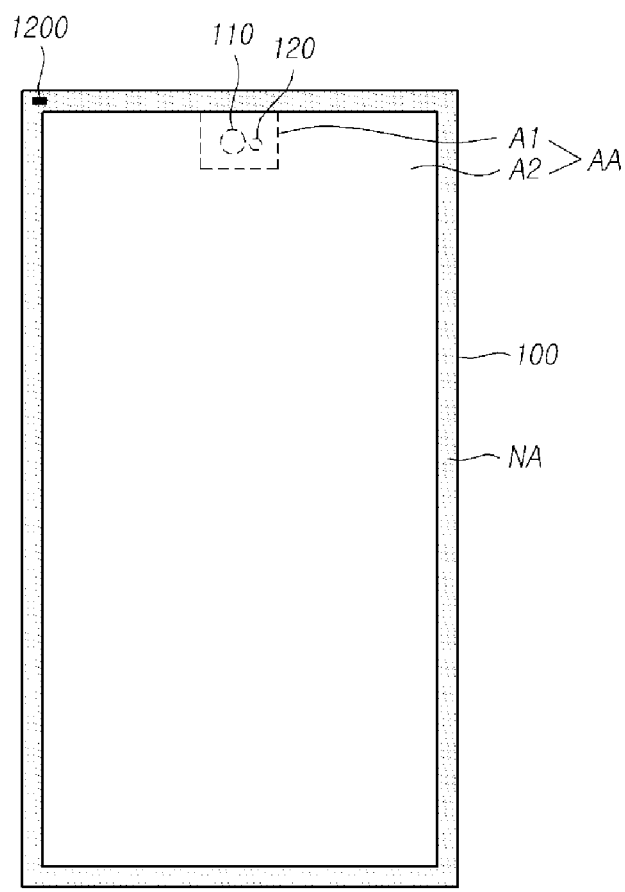
FIGS. 12 and 13 are views for explaining the position of the light generating device for the proximity sensor in the display panel of the display device according to embodiments of the present disclosure.
Figure 13:
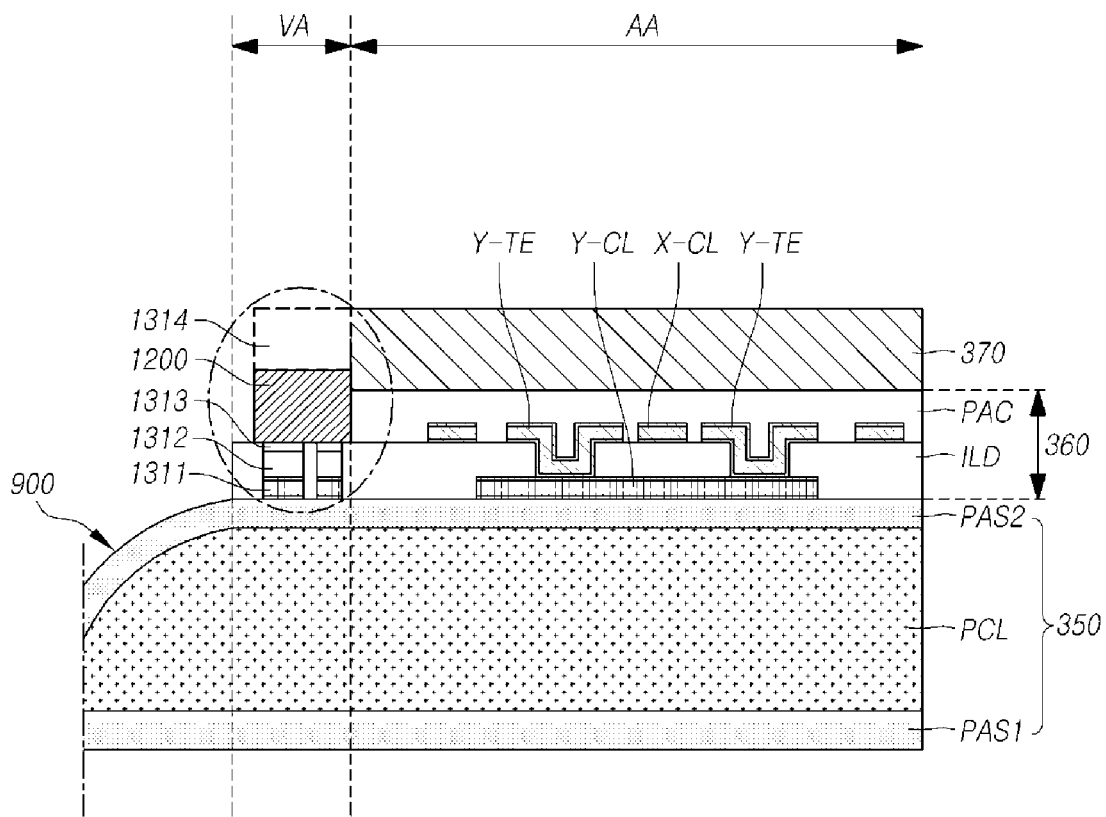

FIGS. 12 and 13 are views for explaining the position of the light generating device 1200 for the proximity sensor 120 in the display panel 100 of the display device 10 according to embodiments of the present disclosure.

Referring to FIGS. 12 and 13, the display device 10 according to embodiments of the present disclosure may include a proximity sensor 120 that detects whether a human body or object is in proximity. The proximity sensor 120 may detect whether a human body or an object is in close proximity by receiving light (e.g., infrared rays) flowing into the light incident part IA.

The display device 10 according to embodiments of the present disclosure may further include a light generating device 1200 that generates light (e.g., infrared light). The proximity sensor 120 may detect a nearby human body or object using light emitted from the light generating device 1200.

When the light generating device 1200 generates light, light generated by the light generating device 1200 and emitted to the outside is reflected by a human body or an object proximate to the display device 10. The reflected light flows into the light incident part IA corresponding to the first area A1 of the display device 10.

Since the proximity sensor 120 is located under the display panel 100, but is located in the first area A1 in the display area AA, the proximity sensor 120 may receive light flowing into the light incident part IA corresponding to the first area A1. The proximity sensor 120 may detect whether a human body or an object is in proximity based on the light received through the light incident part IA. The proximity sensor 120 may be viewed as including a light generating device 1200.

Referring to FIGS. 12 and 13, the light generating device 1200 may be located on the encapsulation layer 350 and may be located on the side of the touch sensor layer 360. For example, the light generating device 1200 may be located on any one of the upper left side, upper right side, lower left side, or lower right side of the touch sensor layer 360. The light generating device 1200 may be located at one corner of the display panel 100.

Referring to FIG. 13, the area between the point where the display area AA ends and the point where the inclined surface 900 of the encapsulation layer 350 starts may be referred to as a viewing area VA. The light generating device 1200 may be positioned on the encapsulation layer 350, but may be located in the viewing area VA between the inclined surface 900 of the encapsulation layer 350 and the display area AA.

With respect to the seating structure of the light generating device 1200, one or more pads 1311 may be disposed at one or more points on the flattened surface of the encapsulation layer 350 in the viewing area VA. One or more bumpers 1313 may be bonded to one or more pads 1311 by the bonding agent 1312. The light generating device 1200 may be mounted on one or more bumpers 1313.

The uppermost point of the light generating device 1200 may be lower than the uppermost point of the polarizing plate 370 formed on the touch sensor layer 360. Therefore, an upper space 1314 may exist on the light generating device 1200. The touch sensor layer 360 includes touch sensor metals including the first touch electrode X-TE, the second touch electrode Y-TE, the first bridge pattern X-CL, and the second bridge pattern Y-CL. Some (e.g., second bridge pattern Y-CL) of the touch sensor metals are disposed on the first touch sensor metal layer, and the rest (e.g., first touch electrode X-TE, second touch electrode Y-TE, first bridge pattern X-CL) may be disposed on the second touch sensor metal layer positioned over the first touch sensor metal layer. The touch sensor layer 360 may further include an interlayer insulating layer ILD positioned between the first touch sensor metal layer and the second touch sensor metal layer, and include a touch protection layer PAC positioned on the second touch sensor metal layer.

Since the light generating device 1200 is lower than the polarizing plate 370 formed on the touch sensor layer 360, the upper space 1314 of the light generating device 1200 corresponds to a hole of the polarizing plate 370.

Figure 14:
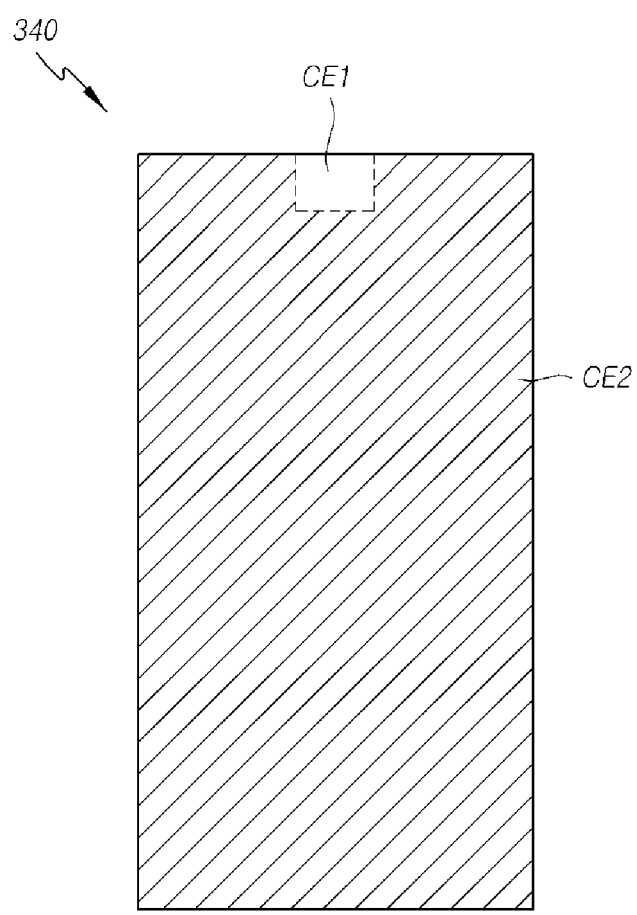
FIG. 14 is a view showing a heterogeneous cathode electrode layer of the display device according to embodiments of the present disclosure.

FIG. 14 is a view showing a heterogeneous cathode electrode layer 340 of the display device 10 according to embodiments of the present disclosure.

Referring to FIG. 14, the heterogeneous cathode electrode layer 340 includes a first cathode electrode CE1 and a second cathode electrode CE2.

The first cathode electrode CE1 may be disposed in the first area A1 and may have a first transmittance equal to or greater than a predetermined threshold transmittance. Here, the first area A1 may overlap the optical device (e.g., camera 110, proximity sensor 120, etc.) and may be a part of the display area AA. The predetermined threshold transmittance may be a minimum transmittance value that allows the functions of the camera 110 and the proximity sensor 120 to be normally performed.

The second cathode electrode CE2 may be disposed in the second area A2 different from the first area A1 in the display area AA, and may have a second transmittance different from the first transmittance of the first cathode electrode CE1. Here, the second transmittance may be lower than the first transmittance, and may be less than the predetermined threshold transmittance.

The first cathode electrode CE1 may be a transparent electrode having the first transmittance higher than the second transmittance. For example, the first cathode electrode CE1 may include one or more of IZO (Indium Zinc Oxide), ITO (Indium Tin Oxide), ZnO (Zinc Oxide), Ba/Ag, Ca/Ag, graphene, silver nanowire, and carbon nanotubes, and the like.

The second cathode electrode CE2 may be a semi-transparent electrode having the second transmittance lower than the first transmittance. For example, the second cathode electrode CE2 may include one or more of Mg, Ag, or the like.

Figure 15:
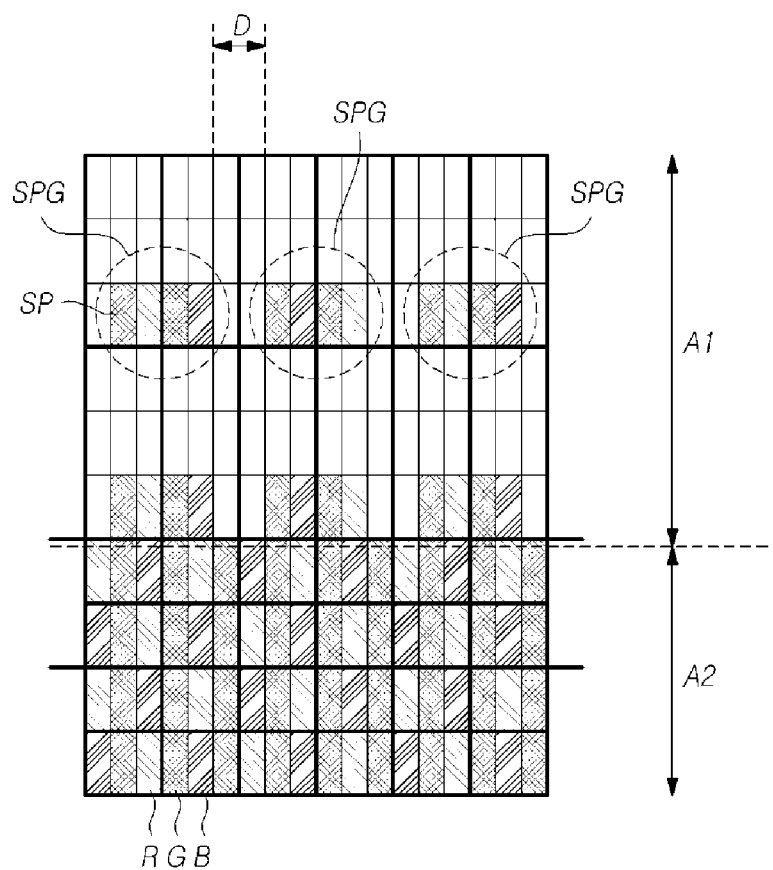
FIGS. 15 and 16 are exemplary views illustrating arrangement structures of subpixels in the first area and arrangement structures of subpixels in the second area in the display panel of the display device according to embodiments of the present disclosure.
Figure 16:
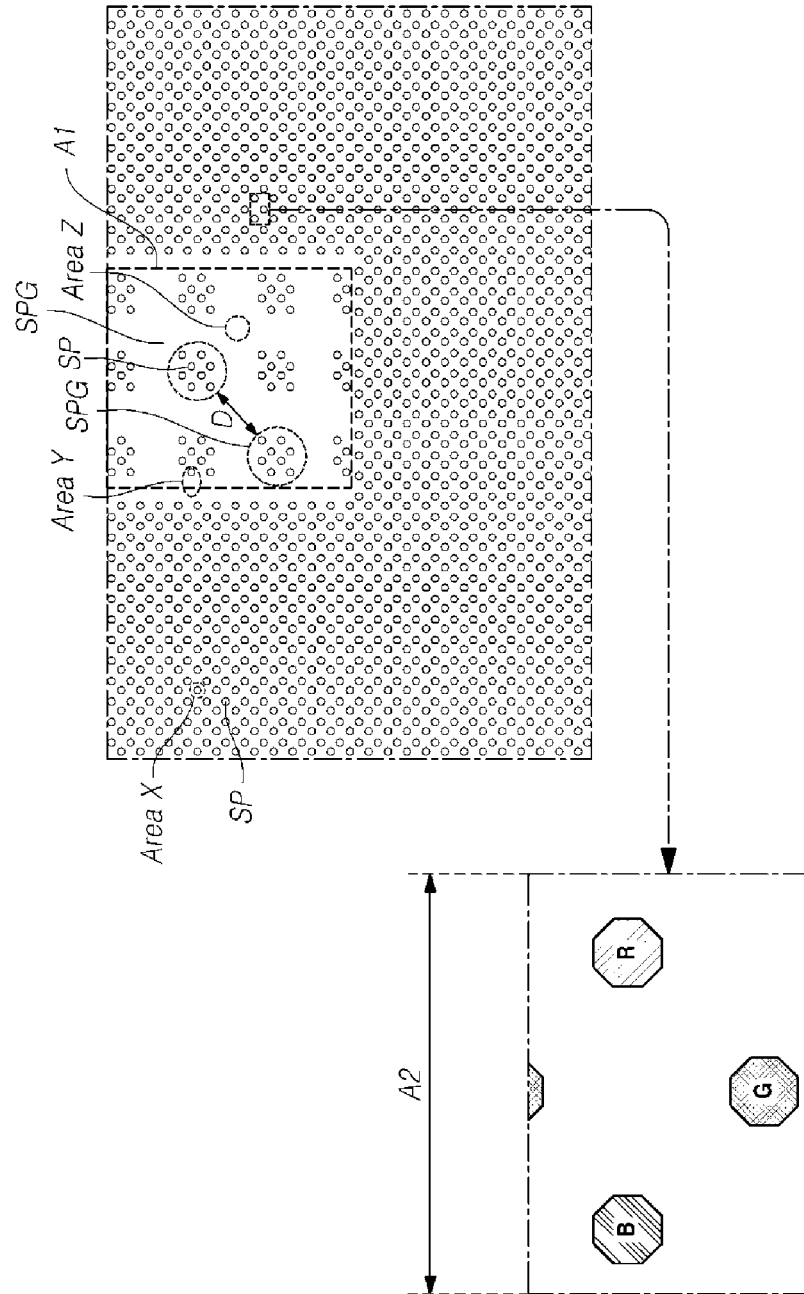

FIGS. 15 and 16 are exemplary views illustrating arrangement structures of subpixels SP in the first area A1 and arrangement structures of subpixels SP in the second area A2 in the display panel 100 of the display device 10 according to embodiments of the present disclosure.

Referring to FIGS. 15 and 16, a plurality of subpixels SP may include a red subpixel R emitting red light, a green subpixel G emitting green light, and a blue subpixel emitting blue light B.

Each of the plurality of subpixels SP may have a shape of a rectangle, a polygon, a circle, an oval, etc. The plurality of subpixels SP may be arranged in a stripe form as shown in FIG. 15 or may be arranged in a dot form as shown in FIG. 16.

Referring to FIGS. 15 and 16, among the first area A1 and the second area A2 constituting the display area AA, the first area A1 may have a lower resolution than the resolution of the second area A2. The first area A1 may correspond to the camera area and/or the proximity sensing area, or overlap the camera area and/or the proximity sensing area, or include the camera area and/or the proximity sensing area.

Referring to FIGS. 15 and 16, the number of subpixels SP per unit area in the first area A1 may be less than the number of subpixels SP per unit area in the second area A2.

Referring to FIGS. 15 and 16, subpixels SP disposed in the first area A1 may constitute subpixel clusters SPG including two or more subpixels SP.

The separation distance D between the subpixel clusters SPG may be greater than the separation distance between two or more subpixels SP included in each of the subpixel clusters SPG.

Referring to FIGS. 15 and 16, even if fewer sub-pixels SP are arranged in the first area A1 than the second area A2, metal patterns such as the data lines DL, the gate line GL, and the anode electrode AE for driving a small number of sub-pixels SP may be disposed in the first area A1. This may slightly degrade the transmittance performance of the first area A1. To compensate for this, subpixel clusters SPG in the first area A1 may be regularly arranged.

Accordingly, a decrease in transmittance performance of the first area A1 may occur regularly and fairly throughout the first area A1. Therefore, a large drop in the shooting performance of the camera 110 or the sensing performance of the proximity sensor 120 can be prevented.

Referring to FIGS. 15 and 16, for example, in each of the subpixel clusters SPG, the number of green subpixels G may be greater than the number of blue subpixels B and the number of red subpixels R. For example, in FIG. 15, each subpixel cluster SPG may include one blue subpixel B, one red subpixel R, and two green subpixels G. In FIG. 16, each subpixel cluster SPG may include two blue subpixels B, two red subpixels R, and four green subpixels G.

Below, cross-sectional structures of areas X, Y, and Z in FIG. 16 will be described with reference to FIGS. 17 to 20. The area X is a subpixel area in which the subpixel SP is disposed in the second area A2. The area Y is a subpixel area in which the subpixel SP is disposed in the first area A1. The area Z is a non-subpixel area in which the subpixel SP is not disposed in the first area A1. However, in FIGS. 17 to 20, the driving transistor DRT has a top gate structure.

Figure 17:
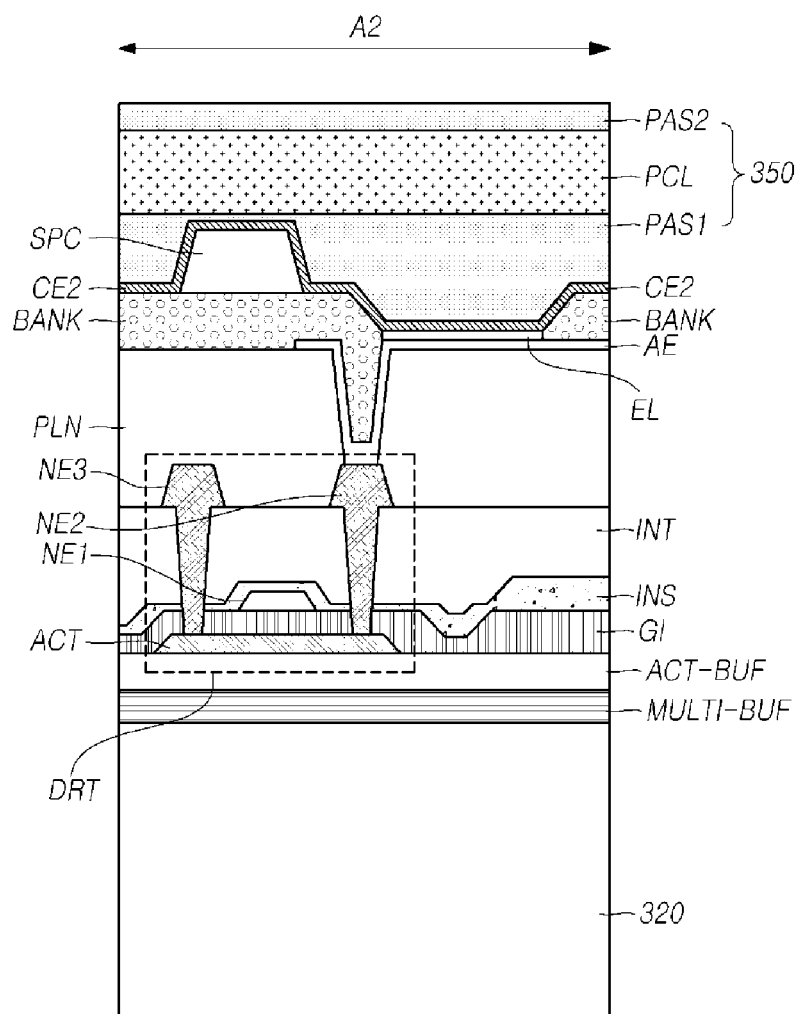
FIG. 17 is a cross-sectional view of a subpixel area in the second area in the display panel of the display device according to embodiments of the present disclosure.

FIG. 17 is a cross-sectional view of a subpixel area X in the second area A2 in the display panel 100 of the display device 10 according to embodiments of the present disclosure.

Referring to FIG. 17, a multi-buffer layer MULTI-BUF and an active-buffer layer ACT-BUF may be disposed on the transparent substrate 320. The active layer ACT may be disposed on the active-buffer layer ACT.

The gate insulating layer GI may be disposed on the active layer ACT. The first node electrode NE1 corresponding to the gate electrode is disposed on the gate insulating layer GI. The insulating layer INS may be disposed while covering the first node electrode NE1. The intermediate layer INT may be disposed on the insulating layer INS. A triple contact hole of the intermediate layer INT, the insulating layer INS, and the gate insulating layer GI may be formed.

A second node electrode NE2 and a third node electrode NE3 made of a source-drain material may be disposed on the intermediate layer INT. The second node electrode NE2 and the third node electrode NE3 may contact the active layer ACT through a triple contact hole of the intermediate layer INT, the insulating layer INS, and the gate insulating layer GI.

A channel may be formed in an area of the active layer ACT that overlaps with the first node electrode NE1 corresponding to the gate electrode. The area of the active layer ACT that does not overlap the first node electrode NE1 may be a conductor area.

In FIG. 17, the active layer ACT, the first node electrode NE1, the second node electrode NE2, and the third node electrode NE3 may form a driving transistor DRT. In this case, the first node electrode NE1 is a gate electrode of the driving transistor DRT, the second node electrode NE2 is a source electrode or a drain electrode of the driving transistor DRT, the third node electrode NE3 is a drain electrode or a source electrode of the driving transistor DRT, and the active layer ACT may be an active layer of the driving transistor DRT.

Referring to FIG. 17, a planarization layer PLN may be disposed on the second node electrode NE2 and the third node electrode NE3. The anode electrode AE may be disposed on the planarization layer PLN. The anode electrode AE may be connected to the second node electrode NE2 (or the third node electrode NE3) of the driving transistor DRT through the contact hole of the planarization layer PLN.

Referring to FIG. 17, the display panel 100 may further include a bank BANK disposed on the planarization layer PLN on which the anode electrode AE is formed. The bank BANK may define a light emitting area of each subpixel SP.

The bank BANK may overlap a portion of the anode electrode AE, and may overlap a portion of the planarization layer PLN.

The display panel 100 may further include a spacer SPC disposed on the bank BANK.

In the area where the bank BANK is opened, the light emitting layer EL may be disposed on the exposed portion of the anode electrode AE. The second cathode electrode CE2 having the second transmittance may be disposed on the emission layer EL.

The second cathode electrode CE2 disposed in the second area A2 among the first cathode electrode CE1 and the second cathode electrode CE2 included in the heterogeneous cathode electrode layer 340 may be a semi-transparent cathode electrode and may have a second transmittance. The second transmittance may be less than the predetermined threshold transmittance. The predetermined threshold transmittance may be a minimum transmittance that allows the functions of the camera 110 and the proximity sensor 120 to be normally performed.

An encapsulation layer 350 including a first inorganic encapsulation layer PAS1, an organic encapsulation layer PCL, a second inorganic encapsulation layer PAS2, and the like may be disposed on the second cathode electrode CE2.

Figure 18:
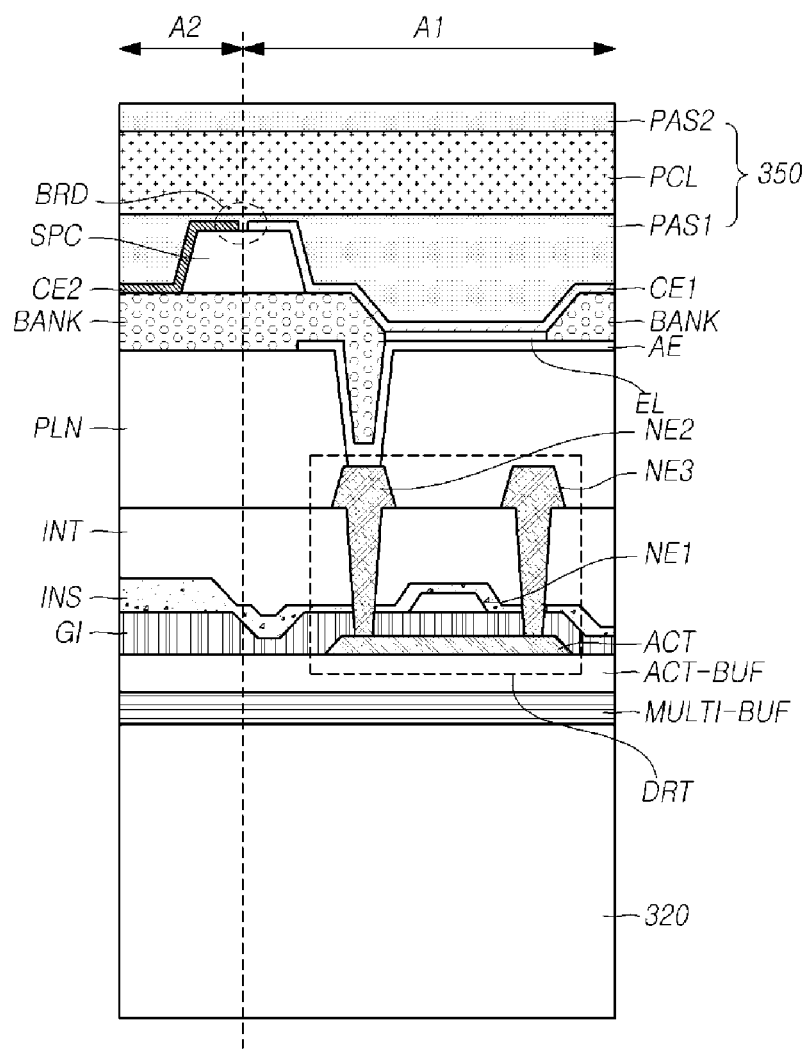
FIG. 18 is a cross-sectional view of a subpixel area in the first area in the display panel of the display device according to embodiments of the present disclosure.

FIG. 18 is a cross-sectional view of a subpixel area Y in the first area A1 in the display panel 100 of the display device 10 according to embodiments of the present disclosure.

Referring to FIG. 18, a multi-buffer layer MULTI-BUF and an active-buffer layer ACT-BUF may be disposed on the transparent substrate 320. The active layer ACT may be disposed on the active-buffer layer ACT-BUF.

A gate insulating layer GI may be disposed on the active layer ACT. The first node electrode NE1 corresponding to the gate electrode may be disposed on the gate insulating layer GI. The insulating layer INS may be disposed while covering the first node electrode NE1. The intermediate layer INT may be disposed on the insulating layer INS. A triple contact hole of the intermediate layer INT, the insulating layer INS, and the gate insulating layer GI is formed.

A second node electrode NE2 and a third node electrode NE3 made of a source-drain material may be disposed on the intermediate layer INT. The second node electrode NE2 and the third node electrode NE3 may be contacted to the active layer ACT through a triple contact hole formed in the intermediate layer INT, the insulating layer INS, and the gate insulating layer GI.

A channel may be formed in an area of the active layer ACT that overlaps with the first node electrode NE1 corresponding to the gate electrode. The area of the active layer ACT that does not overlap the first node electrode NE1 may be a conductor area.

In FIG. 18, the active layer ACT, the first node electrode NE1, the second node electrode NE2, and the third node electrode NE3 may form a driving transistor DRT. In this case, the first node electrode NE1 is a gate electrode of the driving transistor DRT, the second node electrode NE2 is a source electrode or a drain electrode of the driving transistor DRT, the third node electrode NE3 is a drain electrode or a source electrode of the driving transistor DRT, and the active layer ACT may be an active layer of the driving transistor DRT.

Referring to FIG. 18, a planarization layer PLN may be disposed on the second node electrode NE2 and the third node electrode NE3. The anode electrode AE may be disposed on the planarization layer PLN. The anode electrode AE may be connected to the second node electrode NE2 (or the third node electrode NE3) of the driving transistor DRT through the contact hole of the planarization layer PLN.

Referring to FIG. 18, the display panel 100 may further include a bank BANK disposed on the planarization layer PLN on which the anode electrode AE is formed. The bank BANK may define a light emitting area of each subpixel SP. The bank BANK may overlap a portion of the anode electrode AE, and may overlap a portion of the planarization layer PLN.

The display panel 100 may further include a spacer SPC disposed on the bank BANK.

In the area where the bank BANK is open, the light emitting layer EL may be disposed on the exposed portion of the anode electrode AE. A first cathode electrode CE1 having a first transparency may be disposed on the emission layer EL.

The second cathode electrode CE2 disposed in the second area A2 among the first cathode electrode CE1 and the second cathode electrode CE2 included in the heterogeneous cathode electrode layer 340 may be a transparent cathode electrode and may have a first transmittance. The first transmittance may be equal to or greater than the predetermined threshold transmittance. The predetermined threshold transmittance may be a minimum transmittance that allows the functions of the camera 110 and the proximity sensor 120 to be normally performed.

An encapsulation layer 350 including a first inorganic encapsulation layer PAS1, an organic encapsulation layer PCL, a second inorganic encapsulation layer PAS2, and the like may be disposed on the first cathode electrode CE1.

Referring to FIG. 18, the bank BANK defines a light emitting area of each of the plurality of subpixels SP, and may be positioned between the anode electrode layer 332 and the heterogeneous cathode layer 340. The anode electrode layer 332 may include an anode electrode AE disposed on each of the plurality of subpixels SP.

Referring to FIG. 18, the spacer SPC is disposed in a boundary area between the first area A1 and the second area A2 and may be located on the bank BANK. The boundary point BRD of the first cathode electrode CE1 disposed in the first area A1 and the second cathode electrode CE2 disposed in the second area A2 may be located on the spacer SPC.

Figure 19:
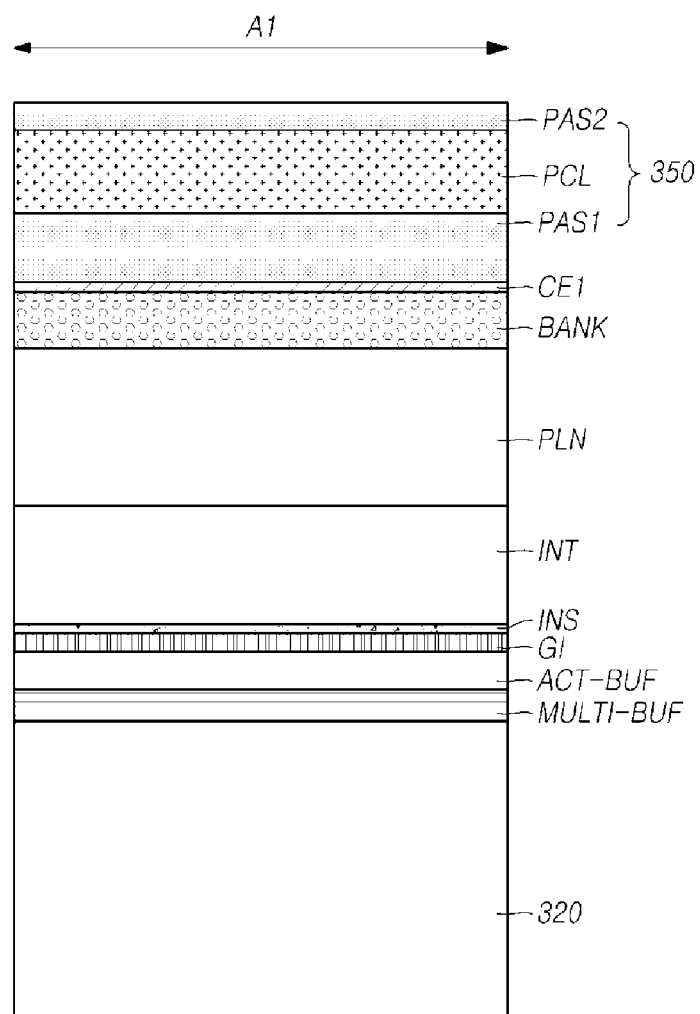
FIG. 19 is a cross-sectional view of a non-subpixel area in the first area in the display panel of the display device according to embodiments of the present disclosure.

FIG. 19 is a cross-sectional view of a non-subpixel area Z in the first area A1 in the display panel 100 of the display device 10 according to embodiments of the present disclosure.

Referring to FIG. 19, the first area A1 may include a non-subpixel area Z. The non-subpixel area Z is a space between subpixel clusters SPG, and may be an area in which the subpixel SP is not disposed.

In the non-subpixel area Z in which the subpixel SP does not exist, transistors (DRT, SCT, etc.), storage capacitor Cst, anode electrode AE, the light emitting layer EL and the like are not disposed. However, the first cathode electrode CE1 having the first transmittance may exist in the non-subpixel area Z.

Referring to FIG. 19, a multi-buffer layer MULTI-BUF and an active-buffer layer ACT-BUF may be disposed on the transparent substrate 320. The active layer ACT may be disposed on the active-buffer layer ACT.

A gate insulating layer GI may be disposed on the active layer ACT. An insulating layer INS may be disposed on the gate insulating layer GI. The intermediate layer INT may be disposed on the insulating layer INS.

The planarization layer PLN may be disposed on the intermediate layer INT. A bank BANK may be disposed on the planarization layer PLN. The first cathode electrode CE1 having the first transmittance may be disposed on the bank BANK.

An encapsulation layer 350 including a first inorganic encapsulation layer PAS1, an organic encapsulation layer PCL, a second inorganic encapsulation layer PAS2, and the like may be disposed on the first cathode electrode CE1.

Figure 20:
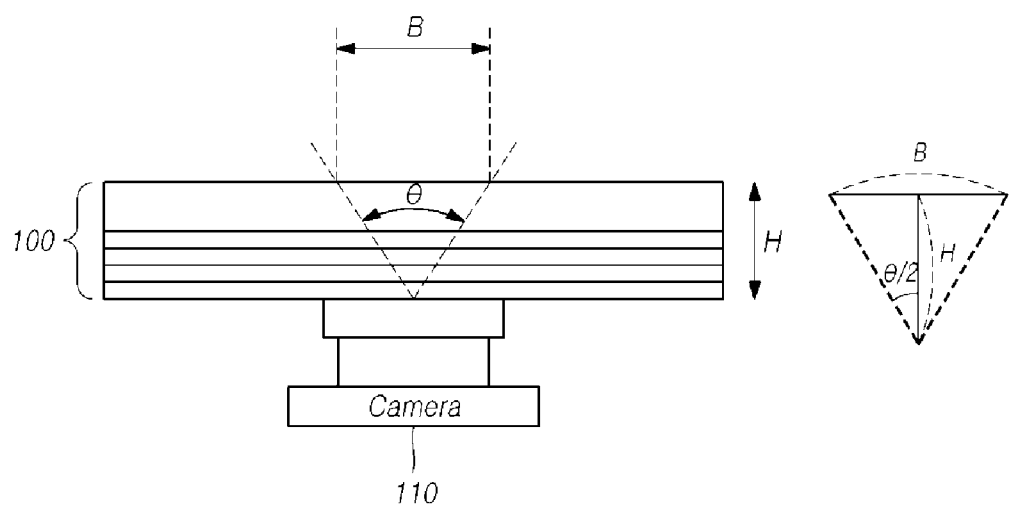
FIG. 20 is a view for explaining a principle of designing an area of the first area for a photographing function of the camera positioned under the display panel in the display device according to embodiments of the present disclosure.

FIG. 20 is a view for explaining a principle of designing an area of the first area A1 for a photographing function of the camera 110 positioned under the display panel 100 in the display device 10 according to embodiments of the present disclosure.

Referring to FIG. 20, and referring to Equation 1 below, the area (S) of the first area A1 may be equal to or greater than a square of a value (B=2×H×tan(θ/2)) calculated by multiplying a value (2H) obtained by doubling a depth (H) of the light incident part IA and a tangent value (tan(θ/2)) for ½ of the angle (θ) of view of the camera 110. Here, the depth H of the light incident part IA may correspond to a distance from the camera 110 to the front surface of the display device 10. The calculation method for the area S of the first area A1 using Equation 1 below may be suitable when the first area A1 has a rectangular shape on a plane.

$$S \geq B^2, B=2 \times H \times \tan(\theta/2) \quad \text{(Equation 1)}$$

In a different way, the area (S) of the first area A1 may be equal to or greater than a circle area having a radius (R=H×tan(θ/2)) calculated by multiplying the depth (H) of the light incident part IA by a tangent value (tan(θ/2)) for ½ of the angle (θ) of view of the camera 110. Here, the depth (H) of the light incident part IA may correspond to a distance from the camera 110 to the front surface of the display device 10. This area calculation method may be suitable when the first area A1 has a circular shape on a plane.

Figure 21:
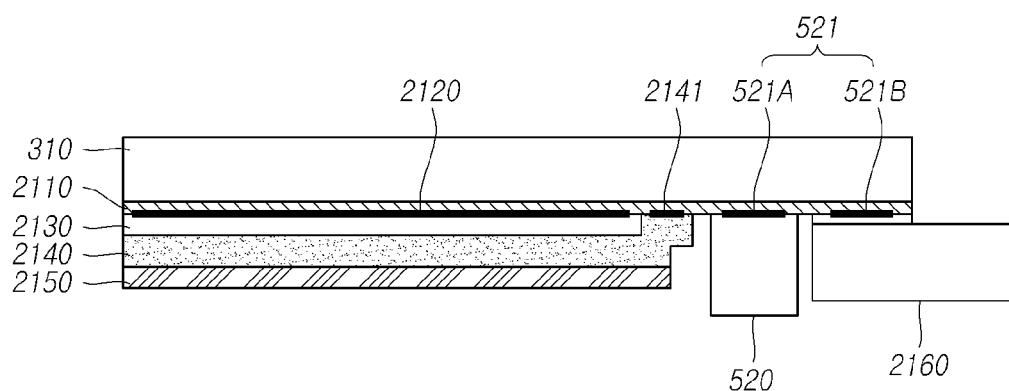
FIG. 21 is a cross-sectional view illustrating components of the fingerprint sensing part in the display device according to embodiments of the present disclosure.

FIG. 21 is a cross-sectional view illustrating components of the fingerprint sensing part in the display device 10 according to embodiments of the present disclosure.

Referring to FIG. 21, the fingerprint sensor panel 300 included in the display device 10 according to embodiments of the present disclosure may be located under the back plate 310 positioned under the transparent substrate 320. Here, the back plate 310 may have a transmittance equal to or greater than the predetermined threshold transmittance. The predetermined threshold transmittance may be a minimum transmittance that allows the functions of the camera 110 and the proximity sensor 120 to be normally performed.

The fingerprint sensor panel 300 may include a plurality of fingerprint sensor blocks (SB).

The fingerprint sensor panel 300 may have a hole or notch groove 500 positioned in a portion corresponding to the first area A1. The cushion plate 306 positioned under the fingerprint sensor panel 300 may have a hole or notch groove 500 positioned in a portion corresponding to the first area A1.

Referring to FIG. 21, the fingerprint sensor panel 300 may include a substrate 2110, a fingerprint transistor array 2120, a piezoelectric material layer 2130, and a common electrode 2140. The substrate 2110 may be disposed under the transparent substrate 320 and may have the hole or notch groove 500 in a portion corresponding to the first area A1. The fingerprint transistor array 2120 may be disposed on the substrate 2110 and may include transistors disposed on each of a plurality of fingerprint sensor blocks SB. The piezoelectric material layer 2130 may be disposed under the fingerprint transistor array 2120. The common electrode 2140 may be disposed under the piezoelectric material layer 2130.

Referring to FIG. 21, the fingerprint sensor panel 300 may further include a protective layer 2150 covering the common electrode 2140.

Referring to FIG. 21, the fingerprint sensor panel 300 may include a fingerprint pad unit 521. The fingerprint pad unit 521 may include a fingerprint pad unit 521A to which the fingerprint driving circuit 520 is electrically connected, and a fingerprint pad unit 521B to which the flexible printed circuit 2160 is electrically connected.

The fingerprint driving circuit 520 may be implemented in the form of an IC chip to be electrically connected to the fingerprint pad unit 521A of the fingerprint sensor panel 300. Alternatively, the fingerprint driving circuit 520 may be mounted on the flexible printed circuit 2160 electrically connected to the fingerprint pad unit 521B of the fingerprint sensor panel 300.

Referring to FIG. 21, the common electrode 2140 may be connected to the pad 2141 of the fingerprint sensor panel 300. Here, a common voltage may be applied to the pad 2141.

Referring to FIG. 21, the fingerprint transistor array 2120 may include driving electrodes disposed for each fingerprint sensing pixel FP-PXL. The driving electrode may be one electrode (source electrode or drain electrode) of the transistor in each fingerprint sensing pixel FP-PXL, or a pattern electrically connected to one electrode of the transistor.

One of the driving electrode and the common electrode 2140 may be applied with a signal (AC signal) having a voltage level fluctuation, and the other may be applied with a signal (DC signal) having a constant voltage level. For example, a common signal in the form of a DC voltage may be applied to the common electrode 2140, and a drive signal in the form of an AC signal may be applied to the driving electrode.

Figure 22:
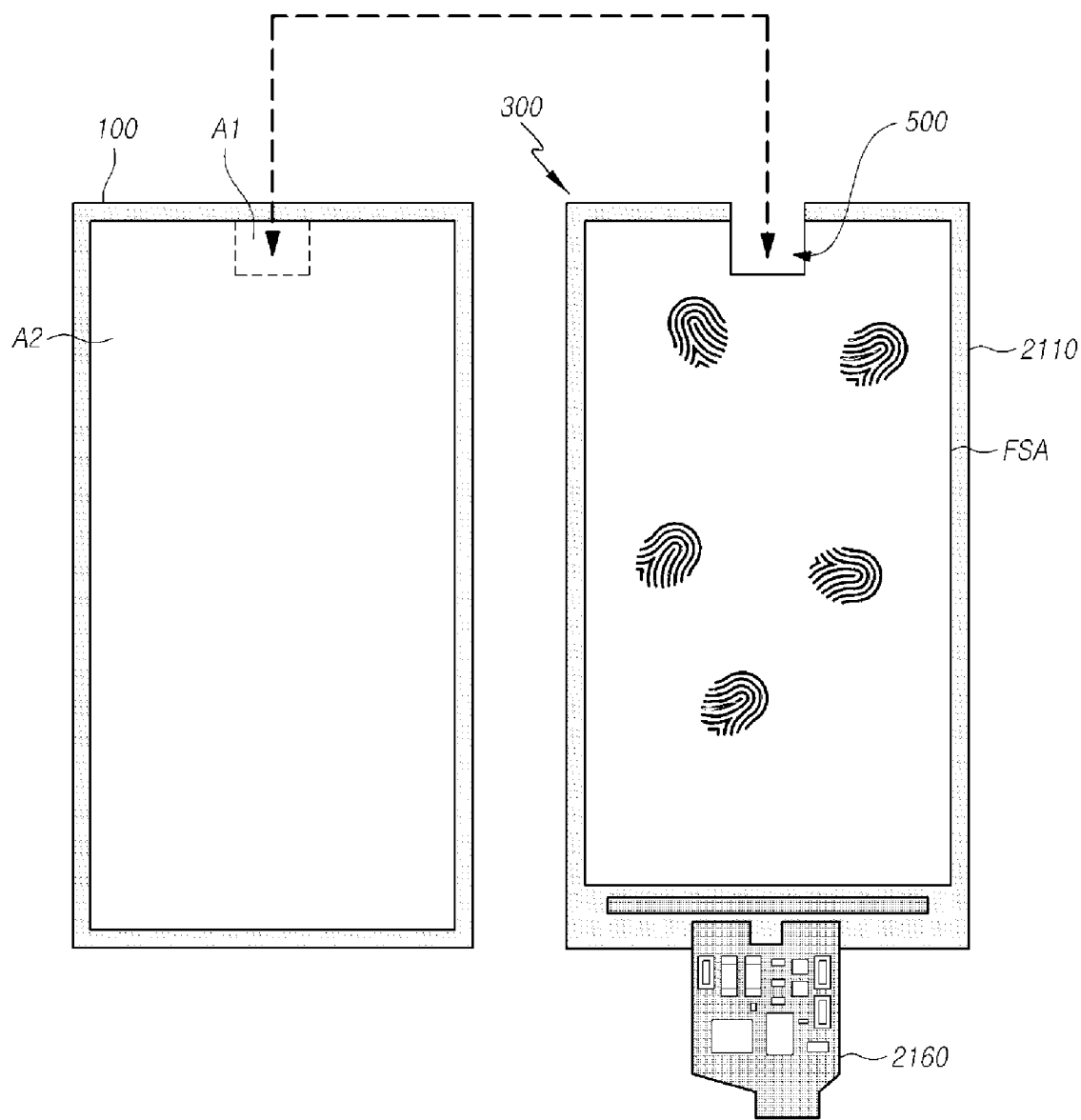
FIGS. 22 and 23 are plan views illustrating components of the fingerprint sensing part of the display device according to embodiments of the present disclosure.
Figure 23:
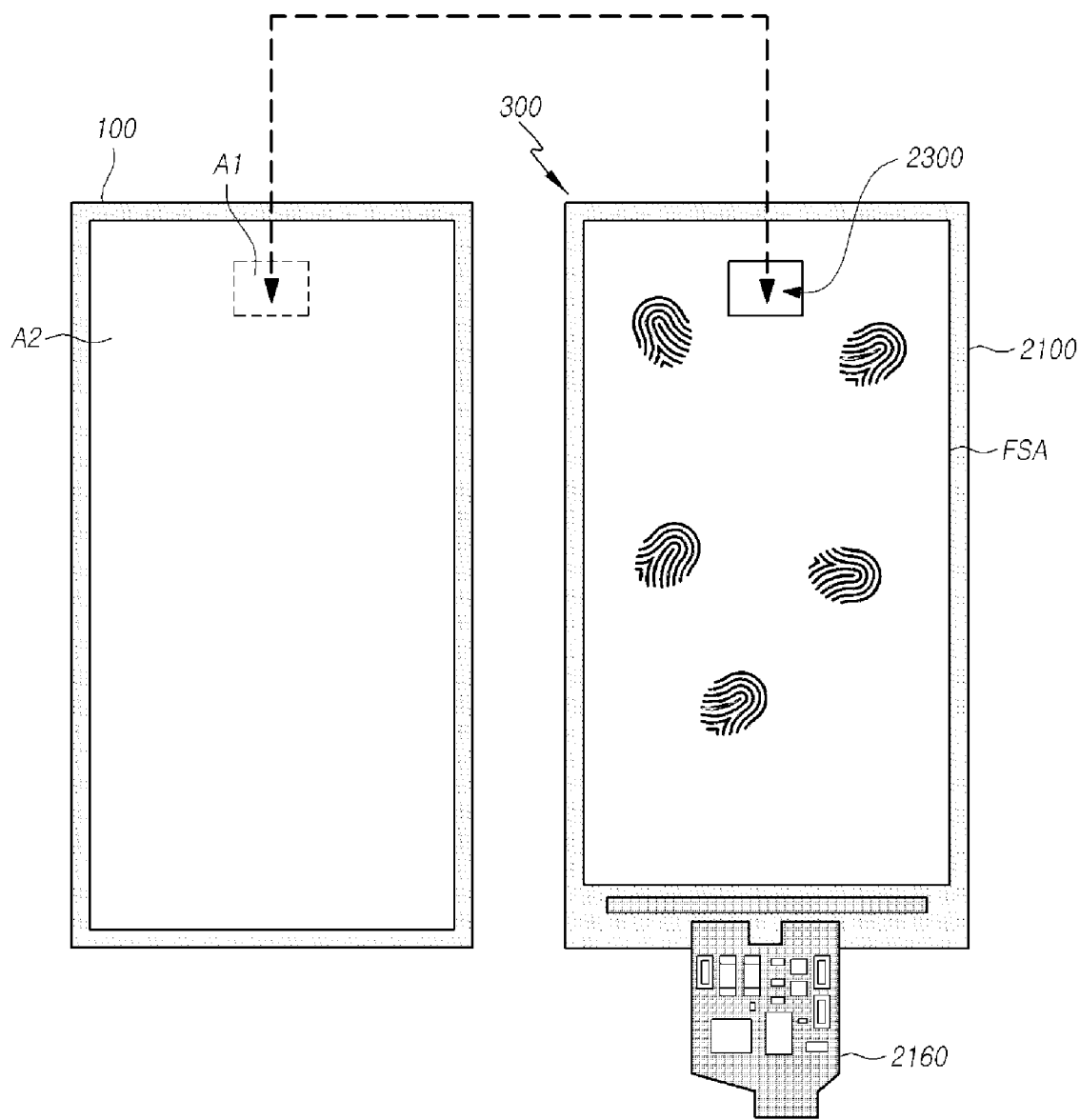

FIGS. 22 and 23 are plan views illustrating components of the fingerprint sensing part of the display device 10 according to embodiments of the present disclosure.

Referring to FIGS. 22 and 23, the camera 110 and the proximity sensor 120 may be positioned under the display panel 100 and are located in the first area A1 in the display area AA. The fingerprint sensor panel 300 may be located on the side of the camera 110 and the proximity sensor 120. In addition, the fingerprint sensor panel 300 should be capable of sensing the fingerprint on the front surface.

Therefore, the fingerprint sensor panel 300 and the substrate 2110 included in the fingerprint sensor panel 300 may have a hole or a notch groove 500 at a position corresponding to the first area A1.

For example, referring to FIG. 22, the first area A1 may be located in the display area AA, but may be located in a boundary area adjacent to the non-display area located outside the display area AA. That is, the first area A1 is surrounded by the second area A2 only in some directions. For example, when the shape of the first area A1 is a square having four sides, three sides of the first area A1 are surrounded by the second area A2, and one side of the first areas A1 is not surrounded by the second area A2. In this case, as shown in FIG. 22, the fingerprint sensor panel 300 and the substrate 2110 included in the fingerprint sensor panel 300 may have a notch groove 500 at a position corresponding to the first area A1.

As another example, referring to FIG. 23, the first area A1 may be located in the center of the display area AA. That is, the first area A1 is surrounded by the second area A2 in all directions. For example, when the shape of the first area A1 is a square having four sides, the four sides of the first area A1 are surrounded by the second area A2. In this case, as illustrated in FIG. 23, the fingerprint sensor panel 300 and the substrate 2110 included in the fingerprint sensor panel 300 may have a hole 2300 at a position corresponding to the first area A1.

The fingerprint sensor panel 300 may sense fingerprints on all areas of the display panel 100. As described above, in order to sense fingerprints in all areas, in the fingerprint sensor panel 300, the plurality of fingerprint sensor blocks SB may be disposed to correspond to all other areas (i.e., the second area A2) except for the first area A1 in the display area AA of the display panel 100.

Referring to FIGS. 22 and 23, the flexible printed circuit 2160 may be connected to the substrate 2110, but may be connected to the opposite side of the position corresponding to the first area A1 (i.e., the opposite side of the notch groove 500).

Figure 24:
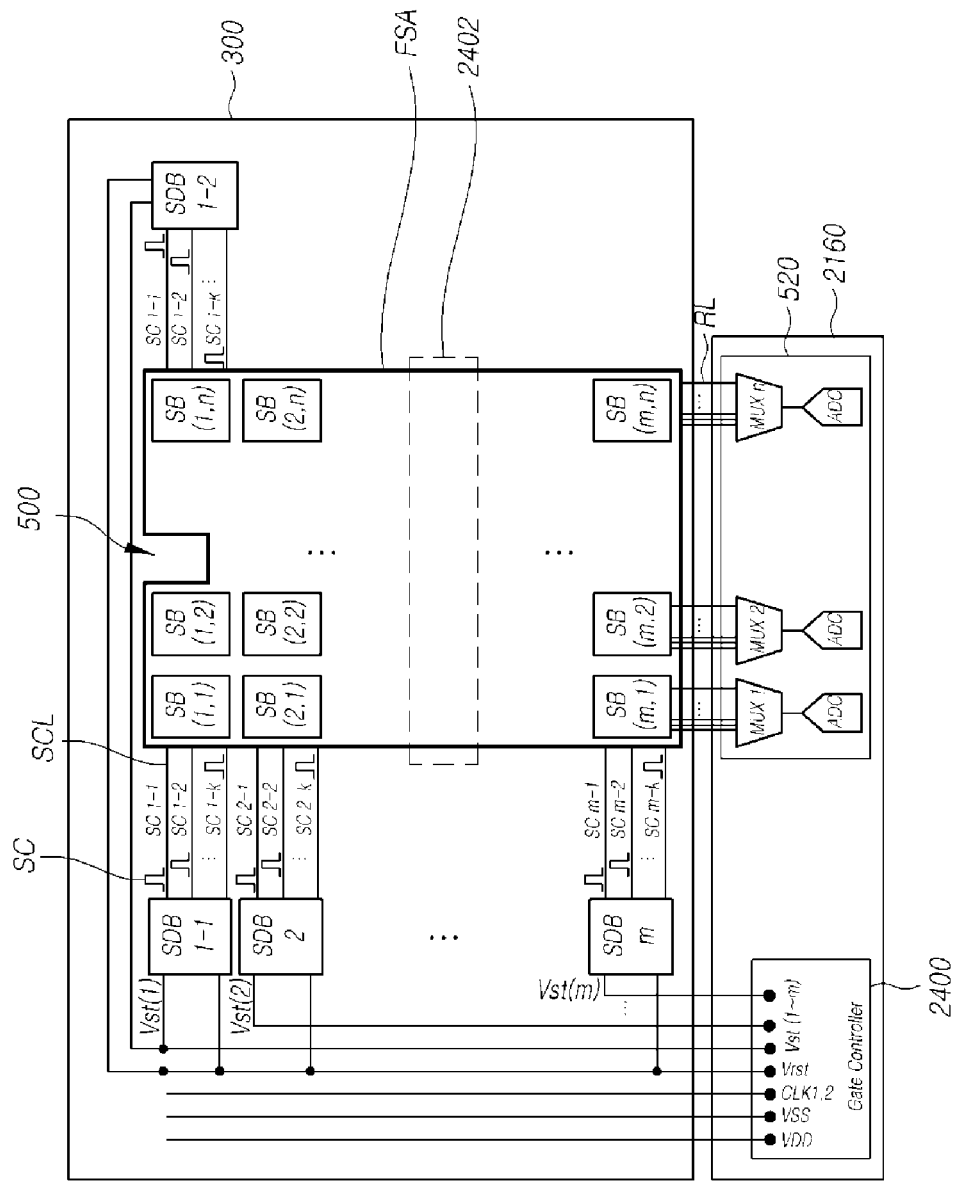
FIG. 24 is a view showing a scan driving of the fingerprint sensor panel of the display device according to embodiments of the present disclosure.

FIG. 24 is a view showing a scan driving of the fingerprint sensor panel 300 of the display device 10 according to embodiments of the present disclosure.

Referring to FIG. 24, the fingerprint sensor panel 300 may include m*n fingerprint sensor blocks (SB (1, 1), SB (1, 2), ..., SB (1, n), SB (2,1), SB (2, 2), ..., SB (2, n), ..., SB (m, 1), SB (m, 2), ..., SB (m, n)). The m*n fingerprint sensor blocks (SB (1, 1)~SB (m, n)) may be arranged in m rows and n columns. Here, m may be a natural number of 1 or more, and n may be a natural number of 1 or more.

Referring to FIG. 24, m*n fingerprint sensor blocks SB (1, 1) to SB (m, n) may each include k*k fingerprint sensing pixels FP-PXL. That is, each of m*n fingerprint sensor blocks SB (1, 1) to SB (m, n) may include fingerprint sensing pixels FP-PXL in k rows and k columns. Here, k is a natural number of 1 or more.

Referring to FIG. 24, m*k scan lines (SCL 1-1, SCL 1-2, ..., SCL 1-$k$, SCL 2-1, SCL 2-2, ..., SCL 2-$k$, ..., SCL m-1, SCL m-2, ..., SCL m-k) for transferring the scan signal (SC 1-1, SC 1-2, ..., SC 1-$k$, SC 2-1, SC 2-2, ..., SC 2-$k$, ..., SC m-1, SC m-2, ..., SC m-k) to m fingerprint sensor block rows may be disposed on the substrate 2110 of the fingerprint sensor panel 300. The n*k read-out lines RL for sensing a signal for sensing a fingerprint in n fingerprint sensor block columns may be disposed on the substrate 2110 of the fingerprint sensor panel 300.

As shown in FIG. 24, the notch groove 500 may exist in an area (corresponding to A1) in which one or more fingerprint sensor block rows among m fingerprint sensor block rows are disposed. In some cases, the hole 2300 may exist instead of the notch groove 500 in an area (corresponding to A1) in which one or more fingerprint sensor block rows among m fingerprint sensor block rows are disposed.

Referring to FIG. 24, the fingerprint sensor panel 300 may further include a plurality of scan driving blocks (SDB 1-1, SDB 1-2, SDB 2, ..., SDB m) corresponding to m fingerprint sensor block rows. For example, a plurality of scan driving blocks (SDB 1-1, SDB 1-2, SDB 2, ..., SDB m) may be a GIP (Gate In Panel) type circuit.

The substrate 2110 may include a fingerprint sensor area FSA and an outer area disposed outside the fingerprint sensor area FSA. The plurality of scan driving blocks (SDB 1-1, SDB 1-2, SDB 2, ..., SDB m) may be disposed in the outer area of the fingerprint sensor area FSA in the substrate 2110. The fingerprint transistor array 2120 may be disposed on the fingerprint sensor area FSA of the substrate 2110.

Each of the plurality of scan driving blocks (SDB 1-1, SDB 1-2, SDB 2, ..., SDB m) may output k scan signals. For example, the first scan driving blocks (SDB 1-1, SDB 1-2) output k scan signals (SC 1-1, SC 1-2, ..., SC 1-$k$) to the fingerprint sensor block row (SB (1, 1), ..., SB (1, n))

of the first row. The second scan driving block (SDB 2) outputs k scan signals (SC 2-1, SC 2-2, . . . , SC 2-k) to the fingerprint sensor block row (SB (2, 1), . . . , SB (2, n)) of the second row. The m-th scan driving block (SDB m) outputs k scan signals (SC m–1, SC m–2, . . . , SC m-k) to the fingerprint sensor block row (SB (m, 1), . . . , SB (m, n)) of the m-th row.

Referring to FIG. 24, a plurality of scan drive blocks (SDB 1-1, SDB 1-2, SDB 2, . . . , SDB m) may include one or more first scan drive blocks SDB 1-1 positioned on one side of the notch groove 500 (or the hole 2300) and one or more second scan driving blocks SDB 1-2 positioned on the other side of the notch groove 500 (or hole 2300 instead of notch groove 500).

Referring to FIG. 24, the plurality of scan lines SCL may include a plurality of first scan lines SCL corresponding to the one or more first scan drive blocks SDB 1-1 and a plurality of second scan line SCL corresponding to one or more second scan drive blocks SDB 1-2. The one or more first scan driving blocks SDB 1-1 output k scan signals (SC 1-1, SC 1-2, . . . , SC 1-k) to a plurality of first scan lines SCL. The k scan signals (SC 1-1, SC 1-2, . . . , SC 1-k) can be transferred to one or more first fingerprint sensor block row (SB (1,1), SB (1,2), . . . ) through a plurality of first scan line (SCL). The one or more first fingerprint sensor block rows (SB (1,1), SB (1,2), . . . ) may be located at one side of the notch groove 500 or the hole 2300. The one or more second scan driving blocks SDB 1-2 output k scan signals (SC 1-1, SC 1-2, . . . , SC 1-k) to the plurality of second scan lines SCL. The k scan signals (SC 1-1, SC 1-2, . . . , SC 1-k) can be transferred to one or more second fingerprint sensor block row ( . . . , SB (1, n)) through a plurality of second scan line (SCL). The one or more second fingerprint sensor block rows ( . . . , SB (1, n)) may be located on the other side of the notch groove 500 or the hole 2300.

Referring to FIG. 24, the fingerprint sensing part of the display device 10 according to embodiments of the present disclosure may further include a gate controller 2400. The gate controller 2400 may supply a start signal (VST(1), VST(2), . . . , VST(m)), a reset signal (Vrst), a clock signal (CLK1,2), a VSS voltage, and a VDD voltage to the plurality of scan driving blocks (SDB 1-1, SDB 1-2, SDB 2, . . . , SDB m).

Referring to FIG. 24, in the fingerprint sensor panel 300, k read-out lines RL corresponding to each of the n fingerprint sensor block columns may be disposed.

Referring to FIG. 24, the fingerprint driving circuit 520 connected to the fingerprint sensor panel 300 may include n multiplexers MUX 1 to MUX n corresponding to each of the n fingerprint sensor block rows, and n analog-to-digital converters ADC connected to the output nodes of the n multiplexers MUX 1 to MUX n. The fingerprint driving circuit 520 may generate fingerprint sensing data including digital values (sensing values) output from n analog-to-digital converters ADC.

Each of the n multiplexers MUX 1 to MUX n can select one of the k read-out lines RL and connect the selected read-out line RL to the analog-to-digital converter ADC through its output node. The k read-out lines RL may correspond to k fingerprint sensing pixels FP-PXL disposed on a selected line (fingerprint sensing pixel row).

Referring to FIG. 24, the fingerprint driving circuit 510 and the gate controller 2400 may be mounted on the flexible printed circuit 2160.

Meanwhile, when the hole 2300 is located in the central portion 2402 of the fingerprint sensor panel 300, the plurality of read-out lines RL may include at least one read-out line RL arranged in a column direction while bypassing one side of the hole 2300.

Figure 25:
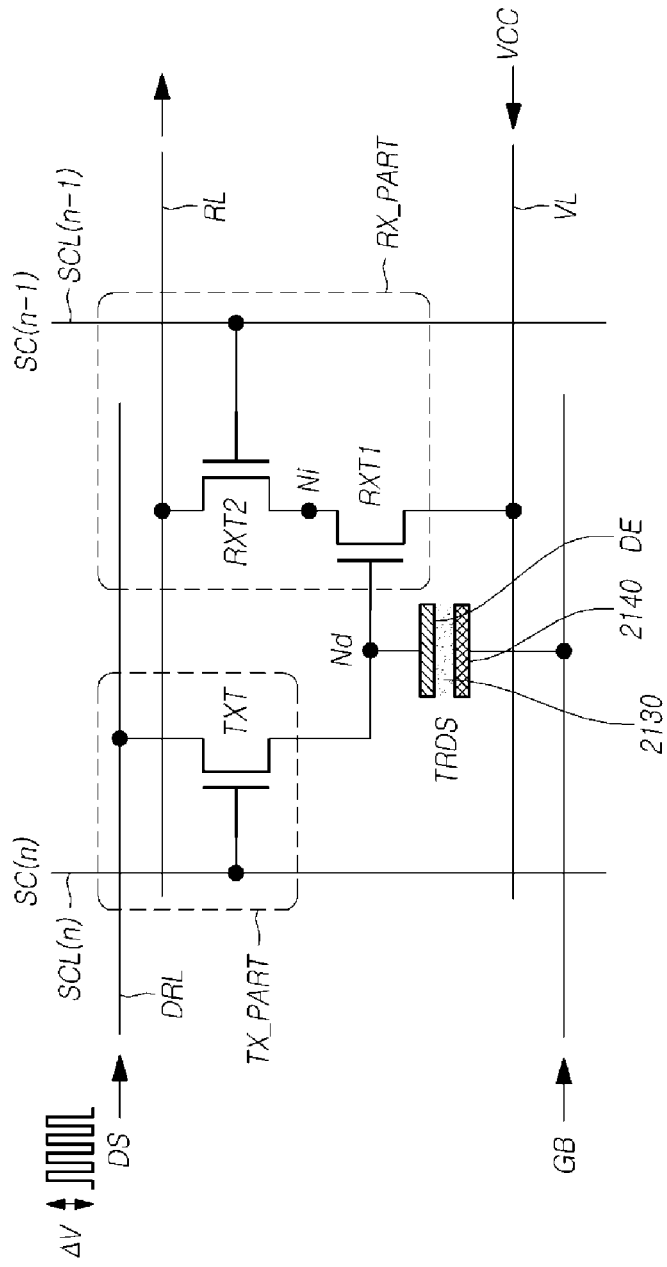
FIG. 25 is an example of an equivalent circuit of the fingerprint sensing pixel in the fingerprint sensor panel of the display device according to embodiments of the present disclosure.

FIG. 25 is an example of an equivalent circuit of the fingerprint sensing pixel in the fingerprint sensor panel 300 of the display device 10 according to embodiments of the present disclosure.

Referring to FIG. 25, a fingerprint sensing pixel FP-PXL disposed on the fingerprint sensor panel 300 of the display device 10 according to embodiments of the present disclosure may include: a transducer TRDS including a driving electrode DE, a piezoelectric material layer 2130, and a common electrode 2140; a transmission part TX-PART configured to be a part operating in the driving mode (transmission mode); and a receiving part RX-PART configured to be a part operating in the sensing mode (receiving mode). The transmission part TX-PART may transmit the driving signal DS to the driving electrode DE of the transducer TRDS. The receiving part RX-PART may allow the fingerprint driving circuit 520 to detect an electrical signal (sensing signal) through the read-out line RL. The term "driving" related to fingerprint sensing may be used in the same sense as "transmission (TX)", and "sensing" may be used in the same sense as "reception (RX, Reception)."

As described above, the transducer TRDS may include a driving electrode DE, a piezoelectric material layer 2130, and a common electrode 2140.

In the transducer TRDS, the driving electrode DE is an electrode to which the driving signal DS can be applied through the transmission part TX-PART. The driving electrode DE corresponds to the driving node Nd. The common electrode 2140 may receive a bias voltage GB corresponding to a common voltage.

For example, the driving signal DS applied to the driving electrode DE may be a signal having a predetermined amplitude ($\Delta V$) and a voltage level change, and may be in the form of an AC signal (also referred to as a pulse signal or a modulation signal). The driving signal DS may have various waveforms such as a square wave, a sinusoidal wave, and a triangular wave.

The driving signal DS may be a signal supplied to one or more fingerprint sensing pixels to be driven among the plurality of fingerprint sensing pixels FP-PXL.

In this specification, the signal applied to the common electrode 2140 is referred to as a bias voltage (GB). The bias voltage GB may be a different voltage from the driving signal DS applied to the driving electrode DE. The bias voltage GB may be a DC voltage. For example, the bias voltage GB may be a DC voltage of a predetermined low voltage level.

When a driving signal DS in the form of an AC signal having a predetermined frequency is applied to the driving electrode DE and a bias voltage GB in the form of a DC signal having a low DC voltage level is applied to the common electrode 2140, the piezoelectric material layer 2130 may vibrate to generate a signal. For example, the signal generated from the transducer TRDS may be electromagnetic waves, or may be ultrasonic waves or sound waves.

Here, for example, when sound waves are generated from the transducer TRDS, the sound waves may have a range of approximately 16 Hz to 20 KHz. In addition, for example, when ultrasonic waves are generated from the transducer TRDS, the ultrasonic waves may have a frequency of 20 KHz or more. That is, ultrasonic waves generated by the transducer TRDS may have a period of 50 μsec or less.

For example, the above-mentioned piezoelectric material layer 2130 may be composed of one or more of ZnO (Zinc Oxide), Perovskite, etc. In addition, various piezoelectric materials may be used. Hereinafter, for convenience of description, it is assumed that the signal generated by the transducer TRDS is ultrasonic.

The above-described transducer TRDS may be a type of energy conversion device or/and signal generating device that converts and generates electrical energy into a signal of another energy type, and when a signal is received, converts the received signal into an electrical energy type signal. For example, the transducer TRDS may be an ultrasonic transducer that generates ultrasonic waves (energy type signal different from electrical energy type) according to electrical energy applied to the driving electrode DE, and generates electrical energy when ultrasonic waves are received.

More specifically, in the transducer TRDS, when a driving signal DS in the form of an AC signal is applied to the driving electrode DE and a bias voltage GB having a low DC voltage level is applied to the common electrode 2140, the piezoelectric material layer 2130 can vibrate by voltages DS and GB applied to the driving electrode DE and the common electrode 2140, and can convert electrical energy by voltages DS and GB applied to the driving electrode DE and the common electrode 2140 into ultrasonic waves, and can generate ultrasonic waves to the outside. Here, the vibration of the piezoelectric material layer 2130 may mean that the polarization state of the piezoelectric material layer 2130 changes.

Then, in the transducer TRDS, when the ultrasonic wave is received by the piezoelectric material layer 2130, the piezoelectric material layer 2130 may vibrate according to the received ultrasonic waves and convert the received ultrasonic waves into voltages in the form of electrical energy. Here, the voltage converted into the form of electrical energy may be generated at the driving electrode DE. Here, the vibration of the piezoelectric material layer 2130 may mean that the polarization state of the piezoelectric material layer 2130 changes.

The transmission part TX-PART may be a circuit part that enables a signal (e.g., ultrasonic wave) to be generated in the transducer TRDS in the driving mode (transmission mode).

The transmission part TX-PART may be controlled by the first scan signal SC (n) supplied through the first scan line SCL (n). The transmission part TX-PART may include a transmission transistor TXT electrically connected between the driving node Nd and the driving line DRL. The driving line DRL may be a line to which the driving signal DS having a voltage level change is supplied. Hereinafter, in consideration of the order of scanning, the first scan line and the first scan signal are referred to as an nth scan line (SCL (n)) and an nth scan signal (SC (n)).

The transmission transistor TXT may be turned on or off by the nth scan signal SC (n) supplied through the nth scan line SCL (n).

When the transmission transistor TXT is turned on by the nth scan signal SC (n), the transmission transistor TXT may transmit the driving signal DS supplied from the driving line DRL to the driving electrode DE of the transducer TRDS.

The reception part RX-PART may be a circuit part that allows a signal to be detected through the read-out line RL in the sensing mode (reception mode).

The reception part RX-PART may include a first receiving transistor RXT1 and a second receiving transistor RXT2 electrically connected between the read-out line RL and the power line VL. Here, the power line VL may be a line to which the power voltage VCC is applied. For example, the power voltage VCC may be a DC voltage.

The first receiving transistor RXT1 and the second receiving transistor RXT2 may be connected in series between the read-out line RL and the power line VL. The source node or drain node of the first receiving transistor RXT1 and the drain node or source node of the second receiving transistor RXT2 may be electrically connected to each other. The gate node of the first receiving transistor RXT1 may be electrically connected to the driving node Ni, and the gate node of the second receiving transistor RXT2 may be electrically connected to the second scan line SCL (n−1). Here, the point (node) to which the first receiving transistor RXT1 and the second receiving transistor RXT2 are connected is referred to as an intermediate node Ni.

The first receiving transistor RXT1 may be electrically connected between the intermediate node Ni and the power line VL. The first receiving transistor RXT1 may be turned on or off by being controlled according to the voltage state of the driving electrode DE electrically connected to the gate node.

The second receiving transistor RXT2 may be electrically connected between the intermediate node Ni and the read-out line RL, and be controlled by the second scan signal SC (n−1) supplied through the second scan line SCL (n−1). The second receiving transistor RXT2 may be turned on or off according to the (n−1) scan signal SC (n−1) applied to the gate node through the (n−1)th scan line SCL (n−1). Hereinafter, considering the order of scanning, the second scan line and the second scan signal are referred to as an (n−1)th scan line SCL (n−1) and an (n−1)th scan signal SC (n−1).

In a situation in which the (n−1)th scan signal SC (n−1) of the turn-on level voltage is applied to the gate node of the second receiving transistor RXT2, when the voltage fluctuation of the driving node Nd occurs according to the first receiving transistor (RXT1) is turned on, the fingerprint driving circuit 520 and the power line VL may be electrically connected.

Accordingly, the fingerprint driving circuit 520 may detect a power voltage VCC or an electrical signal corresponding to the power voltage VCC as a sensing signal.

One fingerprint sensing pixel FP-PXL may operate in a driving mode (transmission mode) or may operate in a sensing mode (reception mode).

Referring to FIG. 25, for example, the fingerprint sensing pixel FP-PXL may operate in a sensing mode (reception mode) for a Tn−1 period. Accordingly, during the Tn−1 period, the (n−1)th scan signal SC (n−1) having the turn-on voltage level is applied to the gate node of the second receiving transistor RXT2 in the corresponding fingerprint sensing pixel FP-PXL. During the Tn−1 period, the corresponding fingerprint sensing pixel FP-PXL does not operate in the driving mode (transmission mode). Accordingly, the nth scan signal SC (n) having the turn-off voltage level may be applied to the gate node of the transmission transistor TXT in the corresponding fingerprint sensing pixel FP-PXL.

During the Tn−1 period, when ultrasonic waves generated by other fingerprint sensing pixels (FP-PXL) are reflected from the surroundings and received by the corresponding fingerprint sensing pixels (FP-PXL), the piezoelectric material layer 2130 of the transducer TRDS vibrates, and a voltage fluctuation occurs in the driving electrode DE. Accordingly, the first receiving transistor RXT1 may be turned on. Accordingly, both the first and second receiving transistors RXT1 and RXT2 are turned on, so that the fingerprint driving circuit 520 detects the power voltage VCC of the power supply line VL through the read-out line RL as a sensing signal.

The fingerprint sensing pixel FP-PXL may operate in a driving mode (transmission mode) for a Tn period different from the Tn−1 period. Accordingly, during the Tn period, the nth scan signal SC (n) having a turn-on voltage level may be applied to the gate node of the transmission transistor TXT in the fingerprint sensing pixel FP-PXL. However, during the Tn period, the corresponding fingerprint sensing pixel FP-PXL does not operate in the sensing mode (reception mode). Accordingly, a (n−1) scan signal SC (n−1) having a turn-off voltage level may be applied to the gate node of the second receiving transistor RXT2.

During the Tn period, the nth scan signal SC (n) having a turn-on voltage level may be applied to the gate node of the transmission transistor TXT in the corresponding fingerprint sensing pixel FP-PXL, so that the transmission transistor TXT is Turn-on. The driving signal DS may be applied to the driving electrode DE of the transducer TRDS through the turned-on transmission transistor TXT. At this time, a bias voltage GB may be applied to the common electrode 2140 of the transducer TRDS. Accordingly, the piezoelectric material layer 2130 between the driving electrode DE and the common electrode 2140 may be vibrated, and ultrasonic waves may be generated.

The nth scan line SCL (n) and the (n−1)th scan line SCL (n−1) may be disposed corresponding to each pixel column. That is, when viewed in one fingerprint sensing pixel row, the nth scan line SCL (n) and the (n−1)th scan line SCL (n−1) may be disposed corresponding to each fingerprint sensing pixel.

Alternatively, each of the nth scan line SCL (n) and the (n−1)th scan line SCL (n−1) may be shared by two-pixel columns. That is, for example, the (n−1) scan line SCL (n−1) may be shared by a receiving part RX-PART of the first fingerprint sensing pixel FP-PXL and a transmitting part TX-PART in another fingerprint sensing pixel FP-PXL adjacent to the receiving part RX-PART of the first fingerprint sensing pixel FP-PXL. The nth scan line SCL (n) may be shared by a transmission part TX-PART of the first fingerprint sensing pixel FP-PXL and a reception part RX-PART in another fingerprint sensing pixel FP-PXL adjacent to the transmission part TX-PART of the first fingerprint sensing pixel FP-PXL.

Figure 26:
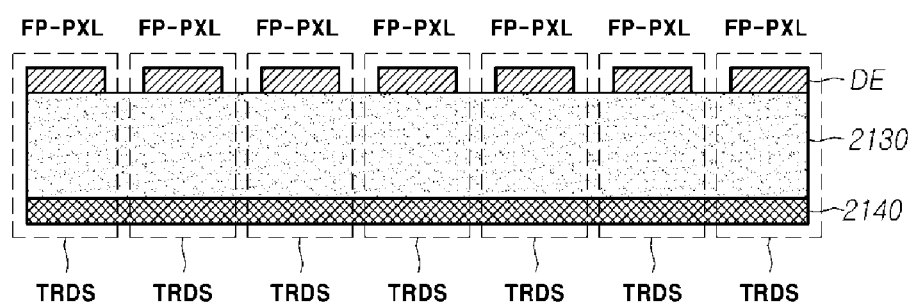
FIG. 26 is a view showing driving electrodes, the piezoelectric material layer, and the common electrode in the fingerprint sensor panel of the display device according to embodiments of the present disclosure.

FIG. 26 is a view showing driving electrodes, the piezoelectric material layer 2130, and the common electrode 2140 in the fingerprint sensor panel 300 of the display device 10 according to embodiments of the present disclosure.

Referring to FIG. 26, each fingerprint sensing pixel FP-PXL may include a transducer TRDS, and the transducer TRDS may include a driving electrode DE, a piezoelectric material layer 2130, and a common electrode 2140.

As illustrated in FIG. 26, in the fingerprint sensor panel 300, the piezoelectric material layer 2130 may be commonly disposed in all areas of the plurality of fingerprint sensing pixels FP-PXL in the form of one plate.

Alternatively, in the fingerprint sensor panel 300, the piezoelectric material layer 2130 may be divided and disposed to correspond to each of the plurality of fingerprint sensing pixels FP-PXL. That is, the piezoelectric material layer 2130 may include a plurality of divided piezoelectric material layers. The division structure of the piezoelectric material layer 2130 may be a structure more suitable for a partial sensing method. According to the partial sensing method, only some of the fingerprint sensing pixels PXL included in the fingerprint sensing pixel column to be sensed may be sensed. According to the partial sensing method, power consumption can be reduced.

That is, the piezoelectric material layer 2130 may be formed on the entire surface without being divided, or may be divided and formed on each fingerprint sensing pixel area.

As illustrated in FIG. 26, the common electrode 2140 may be commonly disposed in all areas of the plurality of fingerprint sensing pixels FP-PXL in the form of one plate electrode.

Alternatively, the common electrode 2140 may be divided and arranged to correspond to each of the plurality of fingerprint sensing pixels FP-PXL. The division structure of the common electrode 2140 may be a structure more suitable for the partial sensing method. According to the partial sensing method, only some of the fingerprint sensing pixels PXL included in the fingerprint sensing pixel column to be sensed may be sensed. According to the partial sensing method, power consumption can be reduced.

In other words, the common electrode 2140 may be formed on the entire surface without being divided, or may be divided and formed on each fingerprint sensing pixel area.

Figure 27:
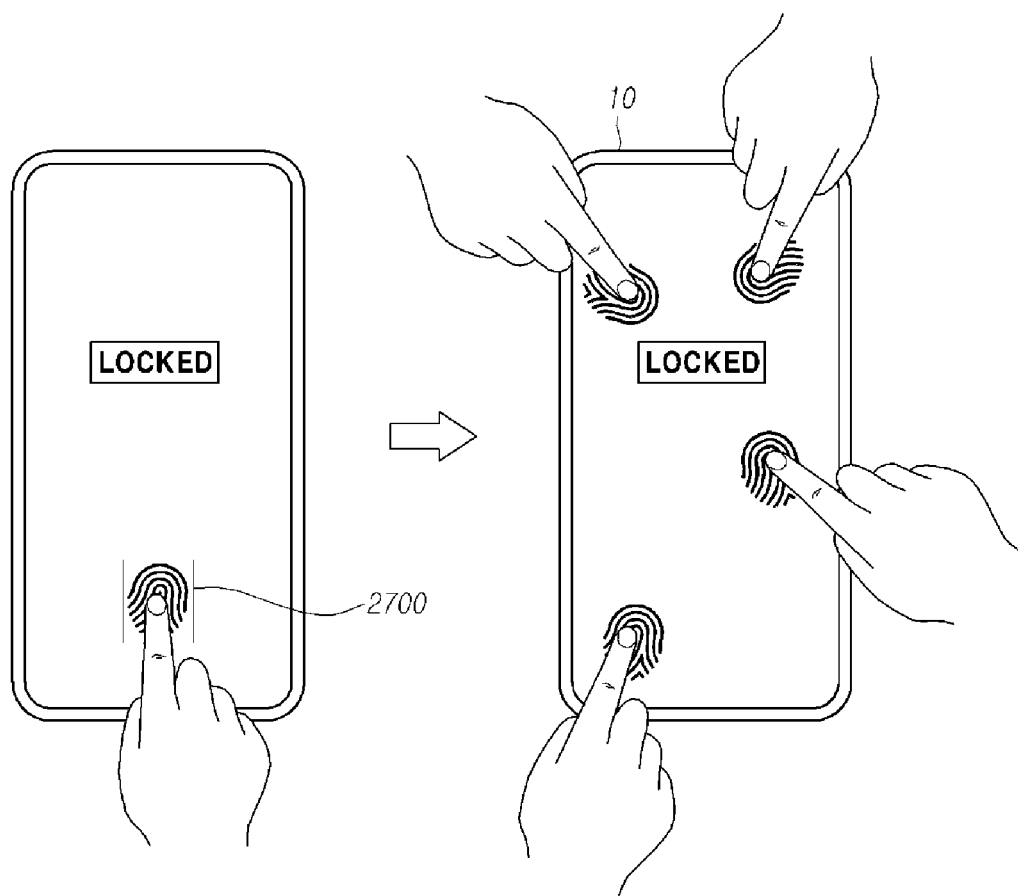
FIGS. 27 to 29 are views exemplarily showing applications using full-area fingerprint sensing of the display device according to embodiments of the present disclosure.
Figure 28:
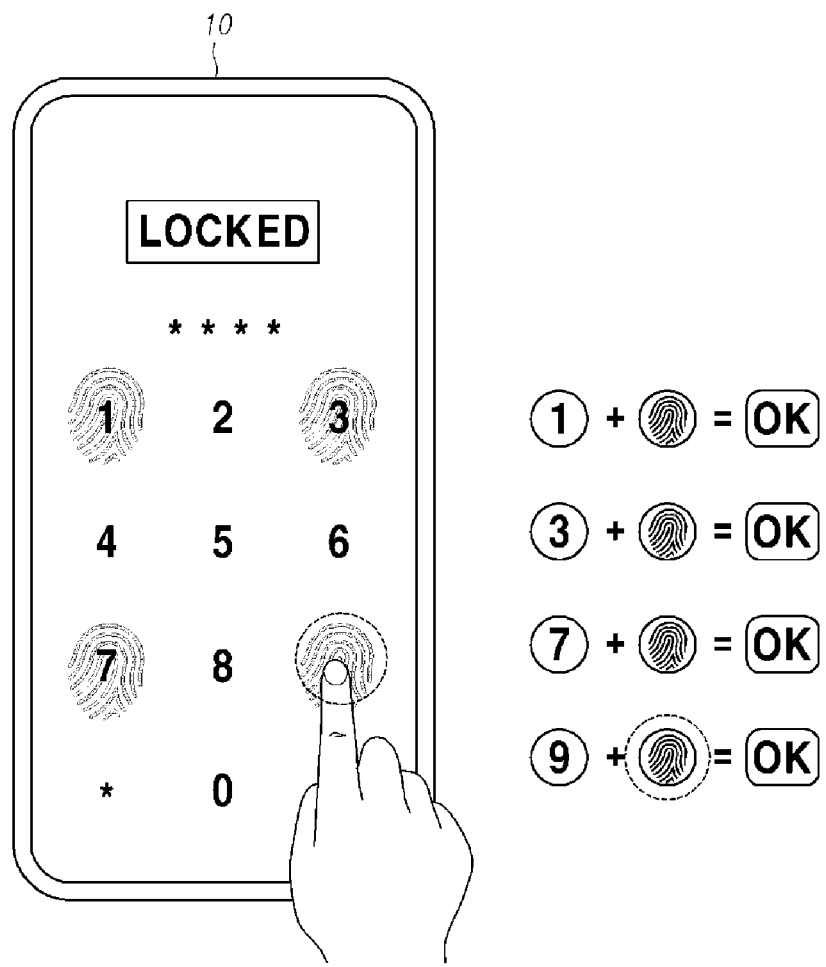
Figure 29:
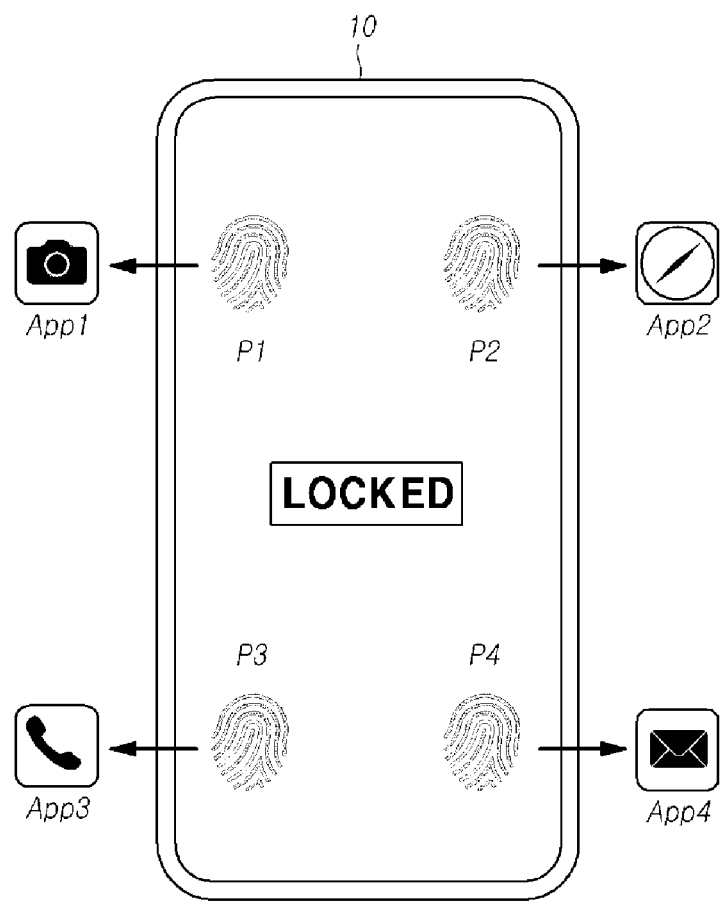

FIGS. 27 to 29 are views exemplarily showing applications using full-area fingerprint sensing of the display device 10 according to embodiments of the present disclosure.

Referring to FIG. 27, the display device 10 may register a user's fingerprint in a specific area 2700 of the display panel 100. The display device 10 may provide unlocking processing of the display device 10 through a fingerprint recognized through the specific area 2700.

Otherwise, referring to FIG. 27, since the display device 10 provides full-area fingerprint recognition processing, the display device 10 may register one or more fingerprints of a user in all areas of the display panel 100 and provide unlocking processing based on one or more fingerprints recognized in all areas of the display panel 100.

Referring to FIG. 28, when a user touches numeric buttons (button 1, button 3, button 7, button 9) on the keyboard screen for unlocking to unlock, the display device 10 senses the numbers (1, 3, 7, 9) corresponding to the number buttons (button 1, button 3, button 7, button 9) touched by the user by sensing the touch position (touch coordinate). Here, the unique touch location information for the number buttons (buttons 0-9) may be stored in advance. Also, the display device 10 recognizes fingerprints of a user who touches numeric buttons (button 1, button 3, button 7, and button 9).

The display device 10 may provide an unlocking process by combining the numeric recognition results (1, 3, 7, 9) with the fingerprint recognition results. Accordingly, the display device 10 can provide higher security.

Referring to FIG. 29, in the display panel 100, applications corresponding to one or more fingerprint recognition locations may be set. For example, four positions P1, P2, P3, and P4 in the display panel 100 may correspond to four applications (App1, App2, App3, and App4).

For example, if the user places the fingerprint on the location P1, the display device 10 recognizes the fingerprint on the location P1. The display device 10 determines whether the recognized fingerprint is the same as the previously registered fingerprint for the location P1. When it is determined that the recognized fingerprint and the pre-registered fingerprint are the same, the display device 10 may control the application P1 corresponding to the location P1 to be executed. At this time, without unlocking, the application App1 may be executed in the lock screen state.

If it is determined that the recognized fingerprint and the pre-registered fingerprint are not the same, the display device 10 may control that the application App1 corresponding to the location P1 cannot be executed.

Figure 30:
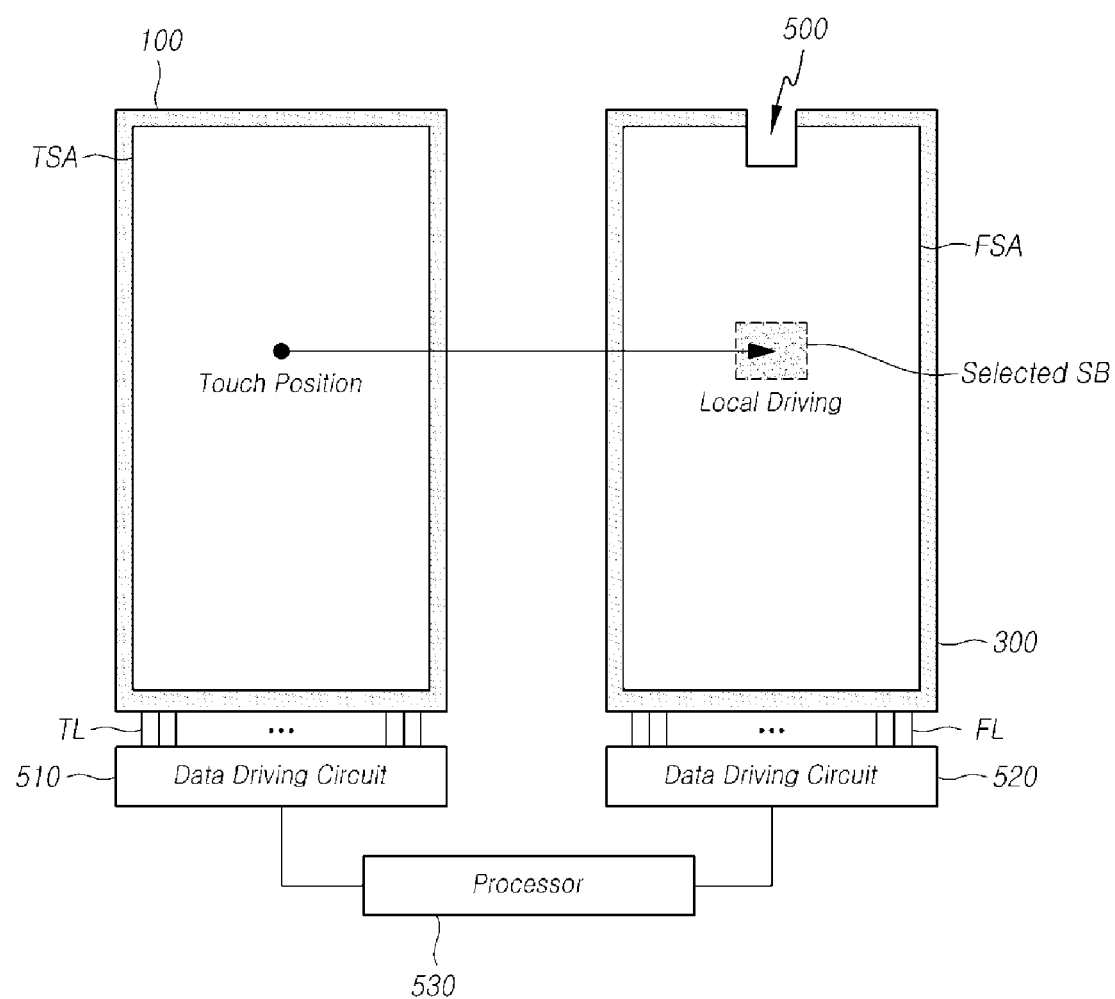
FIG. 30 is a diagram for describing local fingerprint sensing based on touch sensing of the display device according to embodiments of the present disclosure.

FIG. 30 is a diagram for describing local fingerprint sensing based on touch sensing of the display device 10 according to embodiments of the present disclosure.

Referring to FIG. 30, in order to increase the efficiency and speed of fingerprint sensing, the fingerprint driving circuit 520 may perform local driving and local sensing of the fingerprint sensor panel 300 using the touch sensing result.

Referring to FIG. 30, the fingerprint driving circuit 520 may selectively drive one or more fingerprint sensor blocks SB corresponding to a touch position among a plurality of fingerprint sensor blocks included in the fingerprint sensor panel 300.

According to embodiments of the present disclosure, by arranging the optical device under the display panel, it is possible to provide a display device having a design in which an optical device requiring light reception is not exposed to the outside at all.

In addition, according to embodiments of the present disclosure, it is possible to provide a display device in which one or more optical devices of a camera and a proximity sensor are disposed to overlap with a display area under a display panel. Accordingly, one or more optical devices can be prevented from being exposed to the outside of the display device. Therefore, the user cannot visually identify one or more optical devices (or lenses thereof) of the camera and proximity sensor.

In addition, according to embodiments of the present disclosure, it is possible to provide a display device that does not degrade the performance of the optical device while preventing the optical device from being exposed to the outside at all.

In addition, according to embodiments of the present disclosure, it is possible to provide a display device having a structure that prevents the optical device from being exposed to the outside without deteriorating the performance and display performance of the optical device.

In addition, according to embodiments of the present disclosure, it is possible to provide a display device capable of sensing fingerprints in all or part of the display panel. Through this, various applications related to fingerprint recognition can be provided.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
    a transparent substrates;
    an optical device positioned in a display area under the transparent substrate;
    a transistor array positioned in the display area over the transparent substrate;
    an anode electrode layer positioned on the transistor array;
    a light emitting layer positioned on the anode electrode layer;
    a heterogeneous cathode electrode layer positioned on the light emitting layer and comprising a first cathode electrode and a second cathode electrode, wherein the first cathode electrode overlaps the optical device and is disposed in a first area which is a part of the display area, the second cathode electrode is disposed in a second area different from the first area in the display area, the first cathode electrode has a first transmittance, and the second cathode electrode has a second transmittance lower than the first transmittance; and
    an encapsulation layer disposed on the heterogeneous cathode electrode layer.

2. The display device according to claim 1, wherein the first cathode electrode is a transparent electrode having the first transmittance equal to or greater than a predetermined threshold transmittance, and the second cathode electrode is a translucent electrode having the second transmittance less than the predetermined threshold transmittance.

3. The display device according to claim 1, further comprising:
    a bank defining an emission area of each of a plurality of subpixels, wherein the bank positioned between the anode electrode layer on which an anode electrode disposed in each of the plurality of subpixels is located, and the heterogeneous cathode electrode layer; and
    a spacer disposed in a boundary area between the first area and the second area, and positioned on the bank,
    wherein a boundary point between the first cathode electrode and the second cathode electrode is on the spacer.

4. The display device according to claim 1, wherein the first area has a first resolution, the second area has a second resolution, and the first resolution is lower than the second resolution.

5. The display device according to claim 4, wherein subpixels disposed in the first area constitute subpixel clusters including two or more subpixels, and
    wherein a separation distance between the subpixel clusters is greater than a separation distance between two or more subpixels included in each of the subpixel clusters.

6. The display device according to claim 5, wherein a number of subpixels per unit area in the first area is less than a number of subpixels per unit area in the second area, and
    wherein the subpixel clusters in the first area are regularly arranged.

7. The display device according to claim 1, further comprising:
    a touch sensor layer disposed on the encapsulation layer and including a plurality of touch electrodes;
    a touch pad unit disposed on the transparent substrate and positioned in a non-display area, which is an outer area of the display area; and
    a plurality of touch lines electrically connected to all or part of the plurality of touch electrodes and descending along an inclined surface of the encapsulation layer to be electrically connected to the touch pad unit positioned in the non-display area.

8. The display device according to claim 7, wherein each of the plurality of touch electrodes positioned in the first area among the plurality of touch electrodes comprises a transparent electrode or a mesh-type electrode having one or more openings.

9. The display device according to claim 7, further comprising:
a polarizing plate disposed on the touch sensor layer;
an optical transparent adhesive disposed on the polarizing plate; and
a cover glass located on the optical transparent adhesive,
wherein the polarizing plate comprises a first portion corresponding to the first area and a second portion corresponding to the second area, and
wherein the first portion has a higher transmittance than the second portion.

10. The display device according to claim 7, wherein the optical device comprises a camera.

11. The display device according to claim 10, further comprising:
a light generating device; and
a proximity sensor detecting a surrounding human body or object using light emitted from the light generating device,
wherein the optical device further comprises the proximity sensor,
wherein the light generating device is located on the encapsulation layer and is located on a side of the touch sensor layer, and
wherein the proximity sensor is located under the transparent substrate.

12. The display device according to claim 11, wherein the proximity sensor is positioned to overlap the first area.

13. The display device according to claim 11, wherein the light generating device is located in a viewing area between the inclined surface of the encapsulation layer and the display area.

14. The display device according to claim 7, further comprising:
a fingerprint sensor panel disposed under the transparent substrate and including a plurality of fingerprint sensor blocks,
wherein the fingerprint sensor panel comprises a hole or notch groove positioned in a portion corresponding to the first area.

15. The display device according to claim 14, wherein the fingerprint sensor panel comprises:
a substrate disposed under the transparent substrate and comprising the hole or notch groove positioned in the portion corresponding to the first area;
a fingerprint transistor array disposed on the substrate and comprising transistors disposed in each of the plurality of fingerprint sensor blocks;
a piezoelectric material layer disposed under the fingerprint transistor array;
a common electrode disposed under the piezoelectric material layer;
a plurality of scan lines disposed on the substrate to transmit scan signals to a plurality of fingerprint sensor block rows; and
a plurality of read-out lines disposed on the substrate to sense signals from the plurality of fingerprint sensor block rows.

16. The display device according to claim 15, wherein the fingerprint sensor panel further comprises a plurality of scan driving blocks disposed on the substrate and disposed in an outer area of a fingerprint sensor area where the fingerprint transistor array is disposed on the substrate, wherein the plurality of scan driving blocks output the scan signals,
wherein the plurality of scan driving blocks comprise a first scan driving block located on one side and a second scan driving block located on another side, based on the hole or notch groove in the substrate, and
wherein the plurality of scan lines comprise one or more first scan lines for transmitting scan signals output from the first scan driving block to one or more fingerprint sensor block rows located at one side of the hole or notch groove, and one or more second scan lines for transmitting scan signals output from the second scan driving block to one or more fingerprint sensor block rows located at another side of the hole or notch groove.

17. The display device according to claim 15, wherein the plurality of read-out lines include at least one read-out line arranged in a column direction while bypassing a side of the hole or notch groove.

18. The display device according to claim 14, further comprising:
a touch driving circuit configured to generate touch sensing data through the touch electrodes and output the touch sensing data;
a fingerprint driving circuit configured to generate fingerprint sensing data through the fingerprint sensor panel and output the fingerprint sensing data; and
a processor configured to determine a touch location based on the touch sensing data and recognize a fingerprint based on the fingerprint sensing data,
wherein the fingerprint driving circuit selectively drives one or more fingerprint sensor blocks corresponding to the touch position among the plurality of fingerprint sensor blocks included in the fingerprint sensor panel.

19. The display device according to claim 14, wherein the plurality of fingerprint sensor blocks are disposed to correspond to all areas except the first area in the display area.

20. The display device according to claim 14, further comprising a cushion plate located under the fingerprint sensor panel,
wherein the cushion plate comprises a hole or notch groove positioned in a portion corresponding to the first area.

21. The display device according to claim 1, wherein the first area is located in the display area, and is located in a boundary area adjacent to a non-display area located outside the display area, and
wherein only a part of the first area is surrounded by the second area.

22. The display device according to claim 1, wherein the first area is located in a center of the display area, and
wherein the first area is surrounded by the second area in all directions.

23. The display device according to claim 1, wherein the area of the first area is equal to or greater than a square of a value calculated by multiplying a value obtained by doubling a depth of a light incident part and a tangent value for ½ of an angle of view of a camera, and
wherein the depth of the light incident part corresponds to a distance from the camera to a front surface of the display device.

24. The display device according to claim 1, wherein the area of the first area is equal to or greater than a circle area having a radius calculated by multiplying a depth of a light incident part by a tangent value for ½ of an angle of view of a camera, and wherein the depth of the light incident part corresponds to a distance from the camera to a front surface of the display device.

25. The display device according to claim 7, wherein the plurality of touch electrodes include a plurality of first touch electrodes electrically connected by a first bridge pattern and a plurality of second touch electrodes electrically connected by a second bridge pattern, wherein each of the first bridge pattern and the second bridge pattern is disposed to overlap a bank defining an emission area of each of a plurality of subpixels.

26. The display device according to claim 7, further comprising a touch buffer layer between the plurality of touch electrodes and the heterogeneous cathode electrode layer.

27. The display device according to claim 26, wherein the touch buffer layer contains an organic insulating material.

28. The display device according to claim 7, wherein a separation distance between the plurality of touch electrodes and the heterogeneous cathode electrode layer is equal to or greater than a predetermined minimum separation distance.

29. The display device according to claim 8, wherein in an area occupied by the mesh-type electrode, one or more dummy metals where a touch driving signal is not applied and a touch sensing signal is not sensed exist separately from the mesh-type electrode.

* * * * *